(12) United States Patent
Gawankar et al.

(10) Patent No.: US 10,900,915 B2
(45) Date of Patent: Jan. 26, 2021

(54) NMR SEQUENTIAL FLUID CHARACTERIZATION

(71) Applicant: Southwestern Energy Company, Spring, TX (US)

(72) Inventors: Kiran Gawankar, Humble, TX (US); Matthew Boyce, Houston, TX (US)

(73) Assignee: Southwestern Energy Company, Spring, TX (US)

( * ) Notice: Subject to any disclaimer, the term of this patent is extended or adjusted under 35 U.S.C. 154(b) by 337 days.

(21) Appl. No.: 15/775,677

(22) PCT Filed: Nov. 23, 2016

(86) PCT No.: PCT/US2016/063440
§ 371 (c)(1),
(2) Date: May 11, 2018

(87) PCT Pub. No.: WO2017/100000
PCT Pub. Date: Jun. 15, 2017

(65) Prior Publication Data
US 2020/0264116 A1    Aug. 20, 2020

Related U.S. Application Data

(60) Provisional application No. 62/371,876, filed on Aug. 8, 2016, provisional application No. 62/259,347, filed on Nov. 24, 2015.

(51) Int. Cl.
*G01N 24/08* (2006.01)
*G01R 33/44* (2006.01)

(52) U.S. Cl.
CPC ......... *G01N 24/081* (2013.01); *G01R 33/448* (2013.01)

(58) Field of Classification Search
CPC .......................... G01N 24/081; G01R 33/448
See application file for complete search history.

(56) References Cited

U.S. PATENT DOCUMENTS

| | | |
|---|---|---|
| 5,162,733 A | 11/1992 | Baldwin |
| 8,278,922 B2 | 10/2012 | Hurlimann et al. |
| (Continued) | | |

FOREIGN PATENT DOCUMENTS

| | | |
|---|---|---|
| WO | 2013148516 A1 | 10/2013 |
| WO | 2015112449 A1 | 7/2015 |

OTHER PUBLICATIONS

Coates, R., et al., NMR Logging Principles and Applications, Haliburton Energy Services (1999).
(Continued)

*Primary Examiner* — Susan S Lee
(74) *Attorney, Agent, or Firm* — Nielsen IP Law LLC

(57) ABSTRACT

Methods and systems for determining location of hydrocarbon in unconventional plays are provided. The methods provide at least two steps of measuring formation samples as received, as dried and/or as saturated using high resolution NMR, and subsequent processing of the NMR data to determine one of several formation properties or components where the formation property or the component can be used to locate an oil or gas reservoir, complete a well, and/or increase production efficiency. Also, the present methods provide a series of sequential and ordered combination of steps related to the financial evaluation of number of barrels of oil or cubic feet of gas which can be produced at a location.

9 Claims, 36 Drawing Sheets

(56) References Cited

U.S. PATENT DOCUMENTS

| | | | |
|---|---|---|---|
| 2003/0094946 A1 | 5/2003 | Galford et al. | |
| 2006/0272812 A1 | 12/2006 | Yu et al. | |
| 2008/0303520 A1* | 12/2008 | Chen .................. | G01R 33/4816 324/309 |
| 2012/0292022 A1 | 11/2012 | Choban et al. | |
| 2013/0282288 A1* | 10/2013 | Quinn ..................... | G01V 3/38 702/7 |
| 2013/0325348 A1 | 12/2013 | Valori et al. | |

OTHER PUBLICATIONS

Dellenbach, B., An Outcrop to Subsurface Stratigraphic Analysis of the Niobrara Formation, Sand Wash Basin, Colorado, Colorado School of Mines Master's Thesis (2016).

Finn, T. M., et al., Niobrara Total Petroleum System in the Southwestern Wyoming Province, USGS Petroleum Systems and Geologic Assessment of Oil and Gas in the Southwestern Wyoming Province, Wyoming, Colorado, and Utah, Chapter 6 (2005).

Havel, Timothy F., et al., Matrix Decompositions of Two-Dimensional Nuclear Magnetic Resonance Spectra, Proc. Natl. Acad. Sci. USA; 91:7962-7966 (1994).

Jiang, T., et al., Integrated Petrophysical Interpretation of the Eagle Ford Shale with 1-D and 2-D Nuclear Magnetic Resonance (NMR), 54th SPWLA Annual Logging Symposium, Jun. 22-26, 2013.

Kausik, R., et al., NMR Relaxometry in Shale and Implications for Logging, 56th Annual SPWLA Logging Symposium, Jul. 18-22, 2015.

Luffel, L., et al., Evaluation of Devonian Shale With New Core and Log Analysis Methods, JPT; 1192-1197 (1992).

Mansoor, A., et al, Characterizing Light Versus Bound Hydrocarbon in Shale Reservoir by integrating New Two-Dimensional NMR and Advanced Spectroscopy Measurements, URTEC 2016 San Antonio (2016).

Ozen, E., et al., T1/T2 NMR Surface Relaxation Ratio for Hydrocarbons and Brines in Contact with Mature Organic-Shale Reservoir Rocks, Petrophysics 54:11-19 (2013).

Passey, R., et al., My Source Rock is Now My Reservoir—Geologic and Petrophysical Characterization of Shale-Gas Reservoirs, AAPG Search and Discovery, 80231 (2102).

Pittman E., Relationship of Porosity and Permeability to Various Parameters Derived from Mercury Injection-Capillary Pressure Curves for Sandstone, The American Association of Petroleum: Geologists Bulletin, 76:191-198 (1992).

Soeder J. D., Porosity and Permeability of Eastern Devonian Gas Shale, SPE Formation Evaluation, 116-124, Mar. 1988.

Spears. W., et al., Shale Gas Core Analysis: Strategies for Normalizing Between Laboratories and a Clear Need for Standard Materials, SPWLA 52nd Annual Logging Symposium, Colorado Springs Colorado, May 14-18, 2011.

Stout, L. Carbon Isotope Chemostratigraphy of the Niobrara Formation, Denver Basin, CO. Colorado School of Mines Master's Thesis (2012).

Ismail Sulucarnain et al., "An NMR Study of Shale Wettability and Effective Surface Relaxivity", SPE Canadian Unconventional Resources Conference 2012, 2012, pp. 356-366, XP055595956, Canada.

European Search Report dated Jun. 21, 2019, corresponding to European Application No. 16873588.4; 5 pages.

* cited by examiner

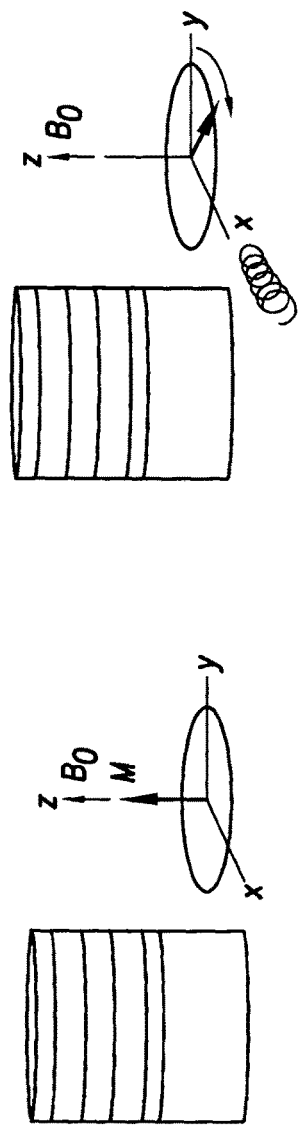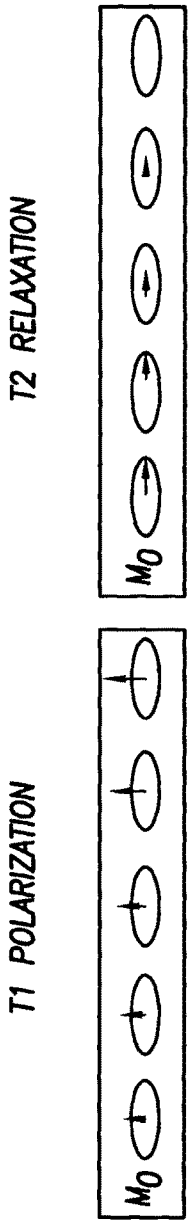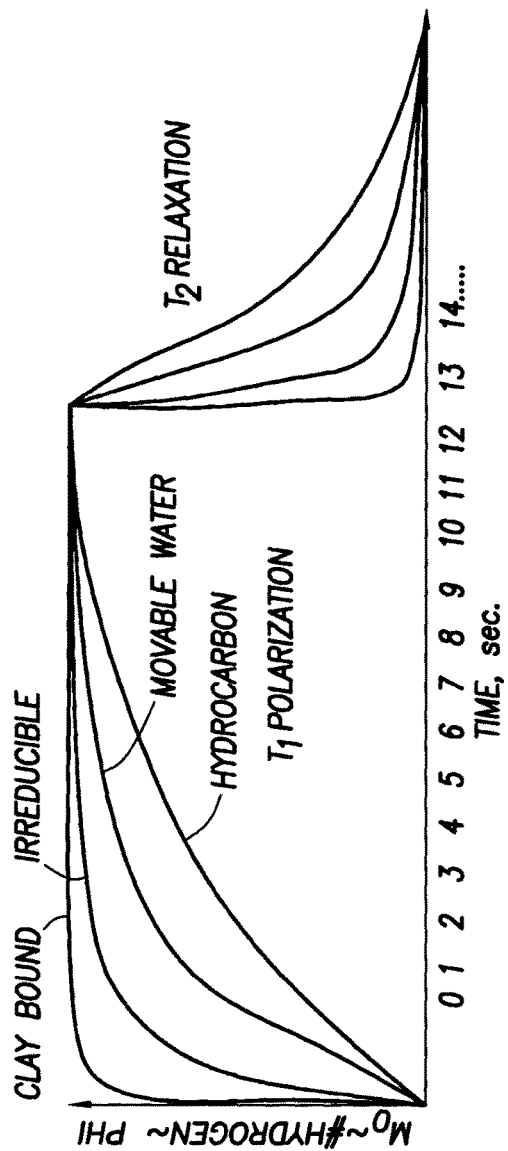
FIG.4

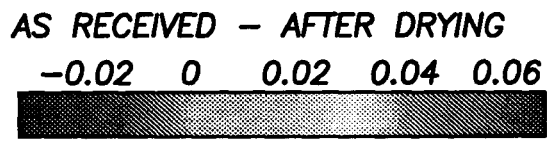
FIG.12A1
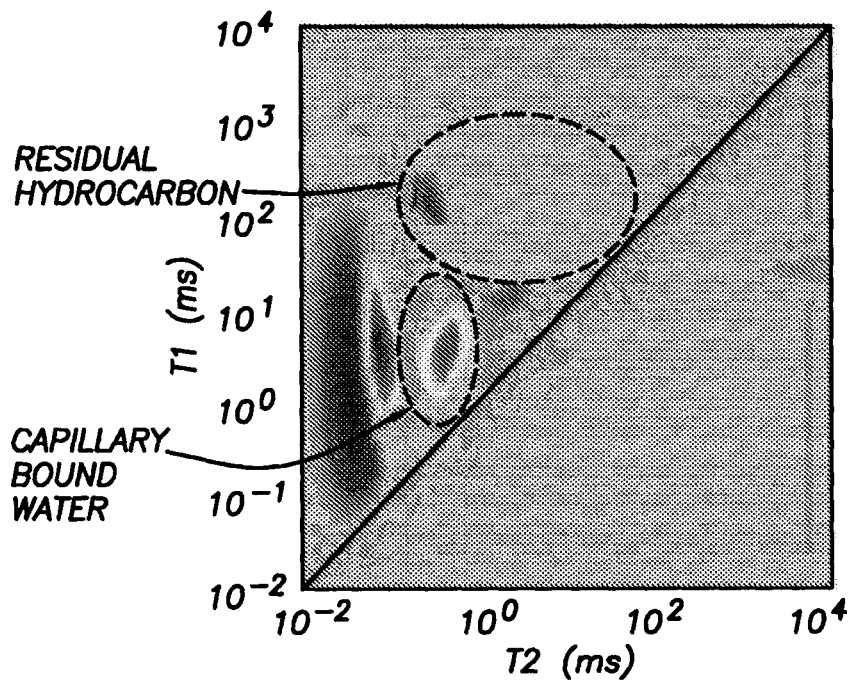
FIG.12A2
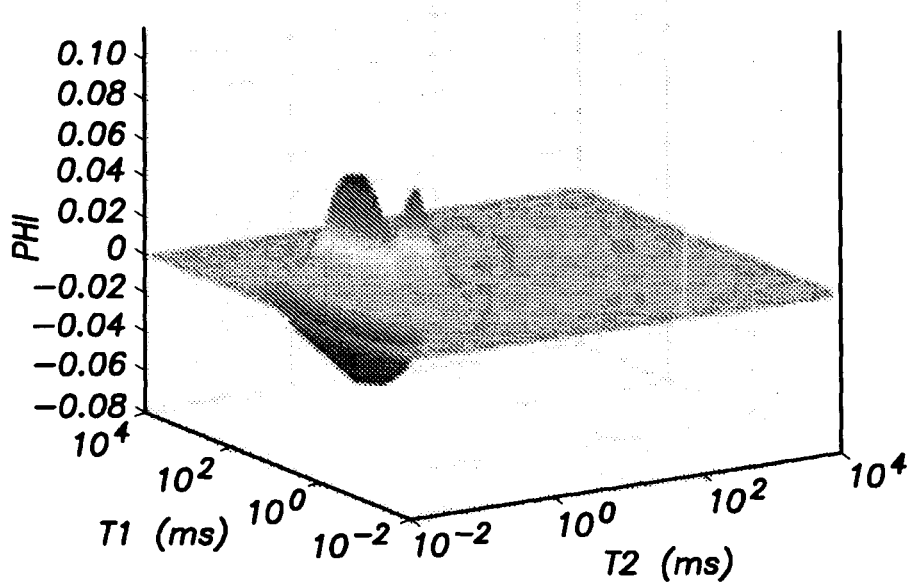
FIG.12A3

AFTER BRINE IMBIBITION – AFTER DRYING
FIG.12B1
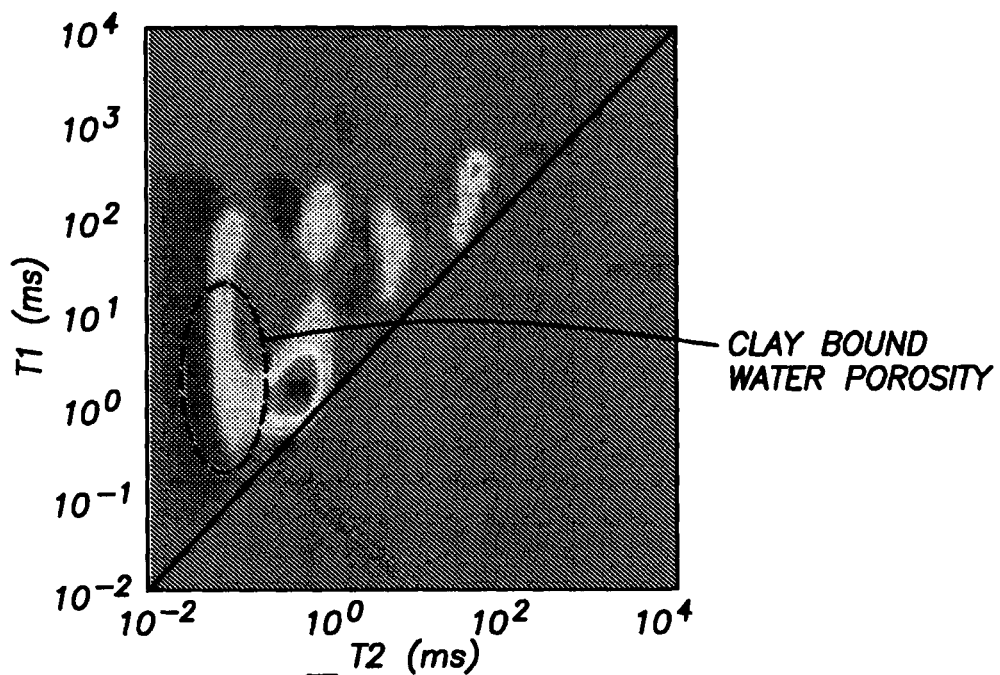
FIG.12B2
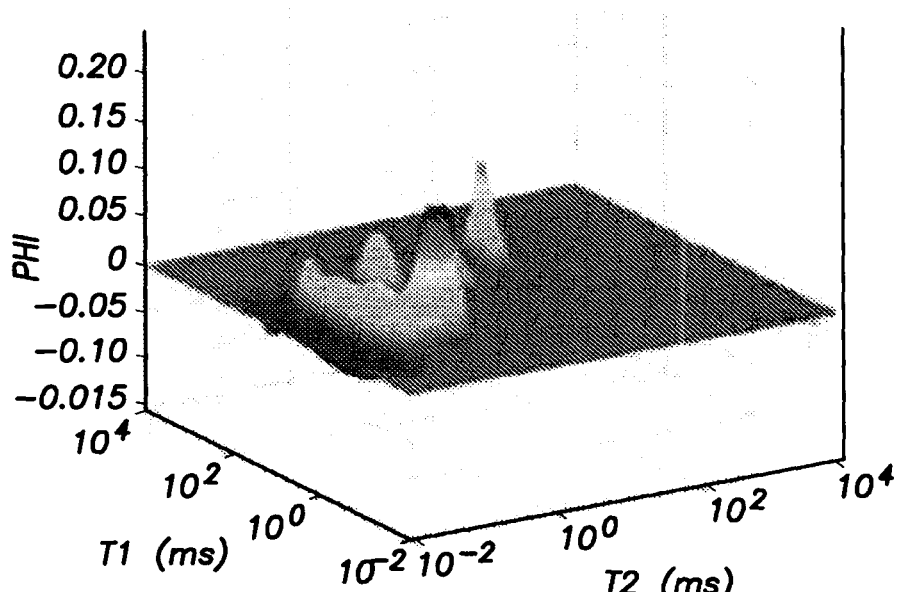
FIG.12B3

AFTER IMBIBITION — AS RECEIVED
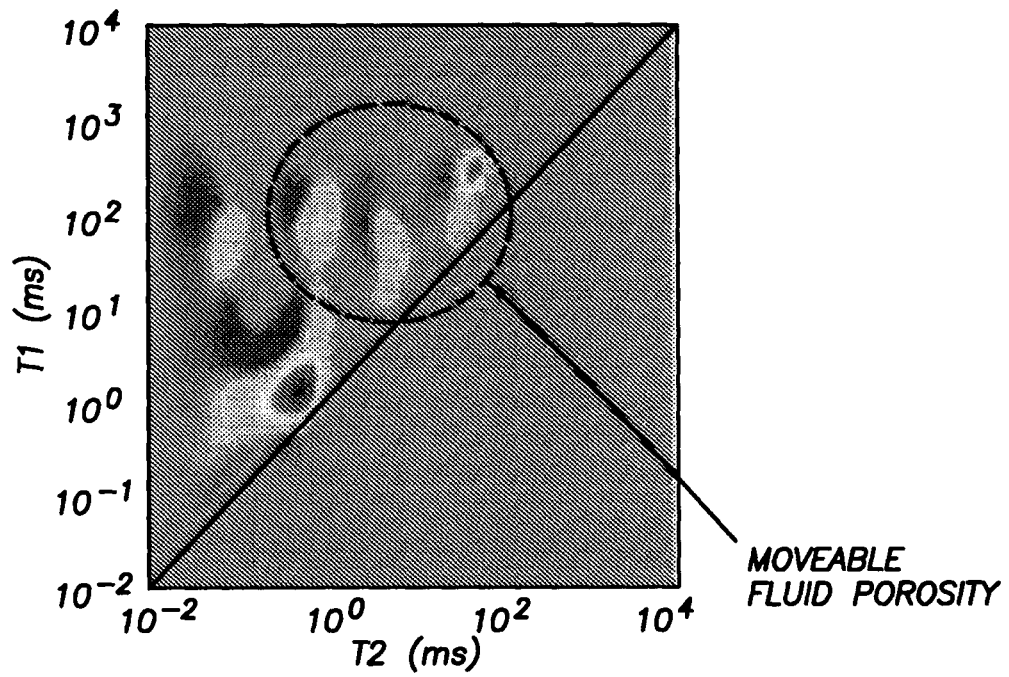
FIG.12C1
FIG.12C2
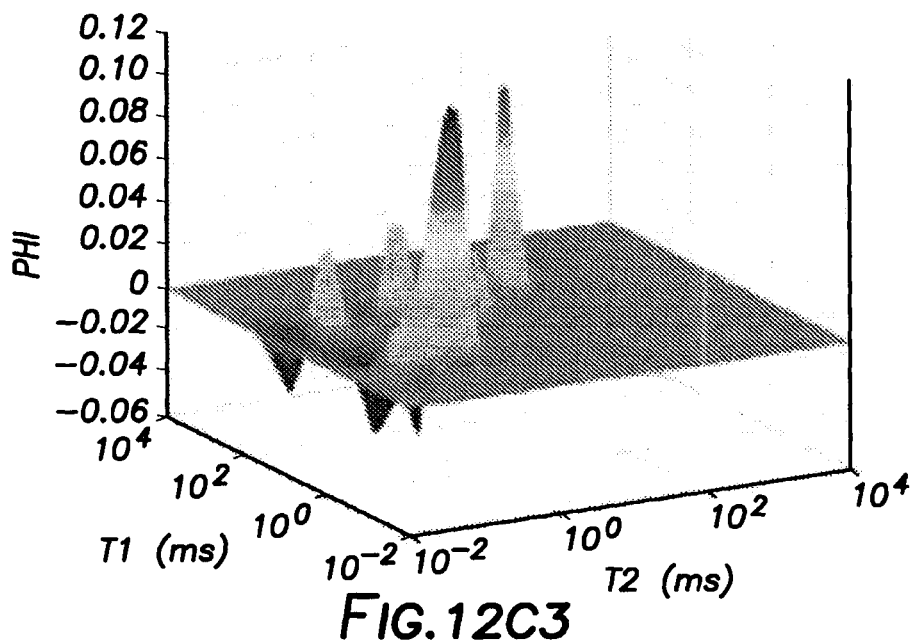
FIG.12C3

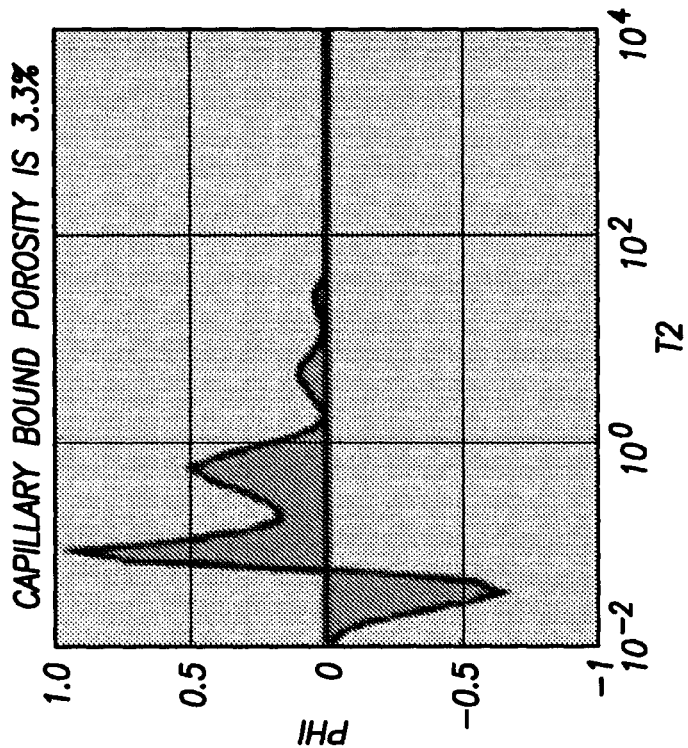
FIG.13A2
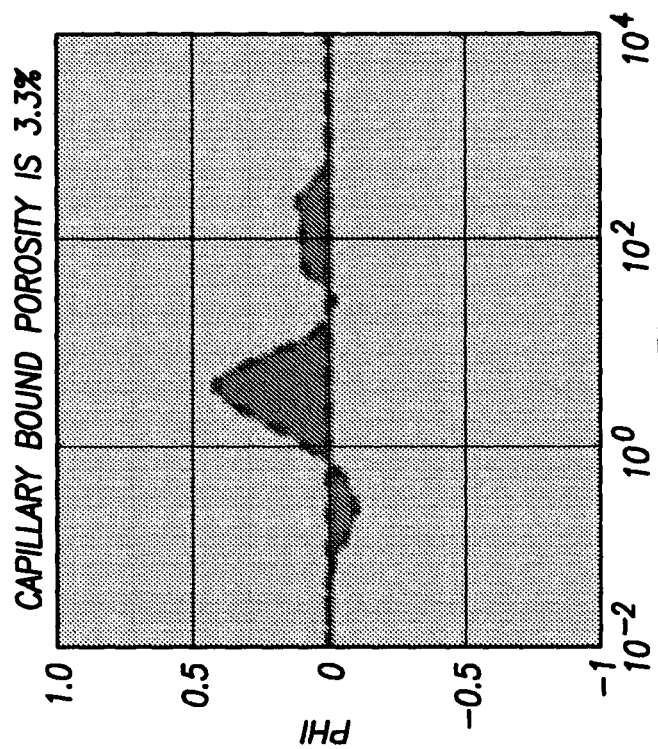
FIG.13A1

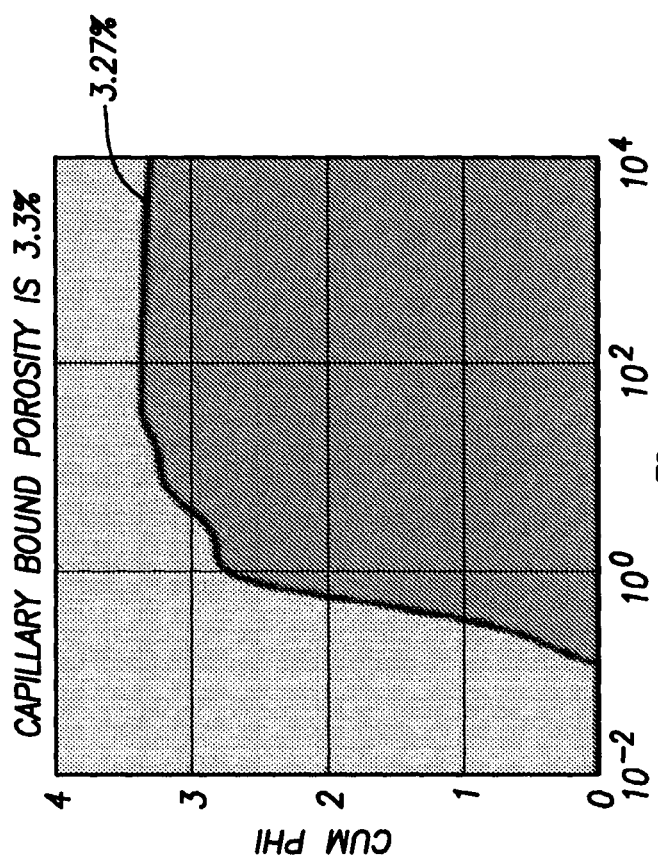
FIG.13B2
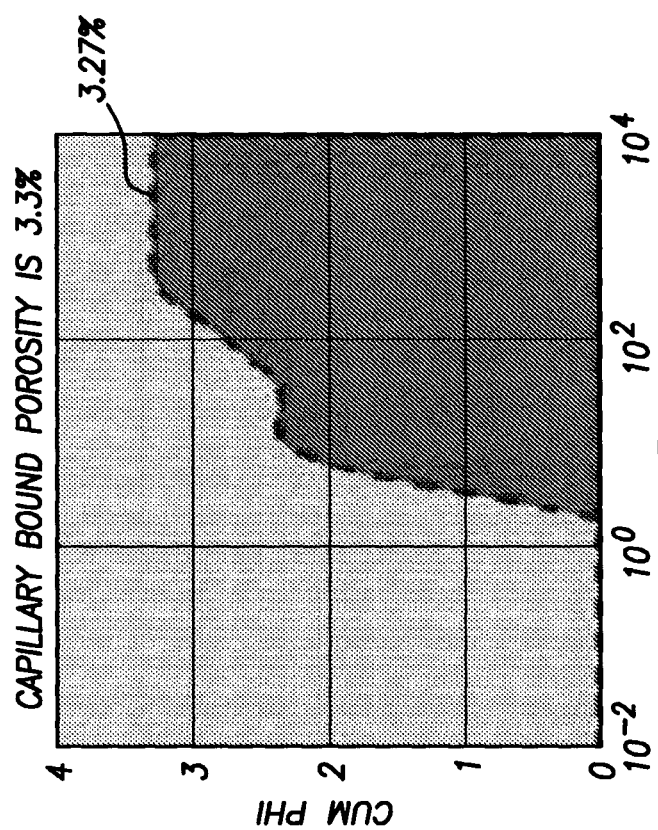
FIG.13B1

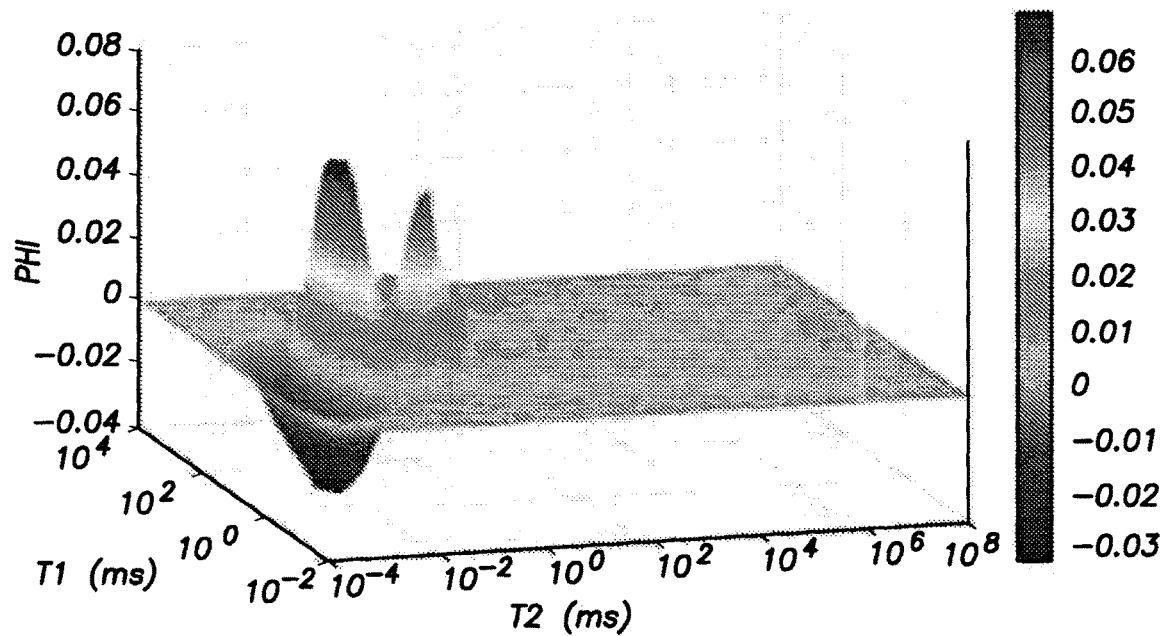
FIG.13C1
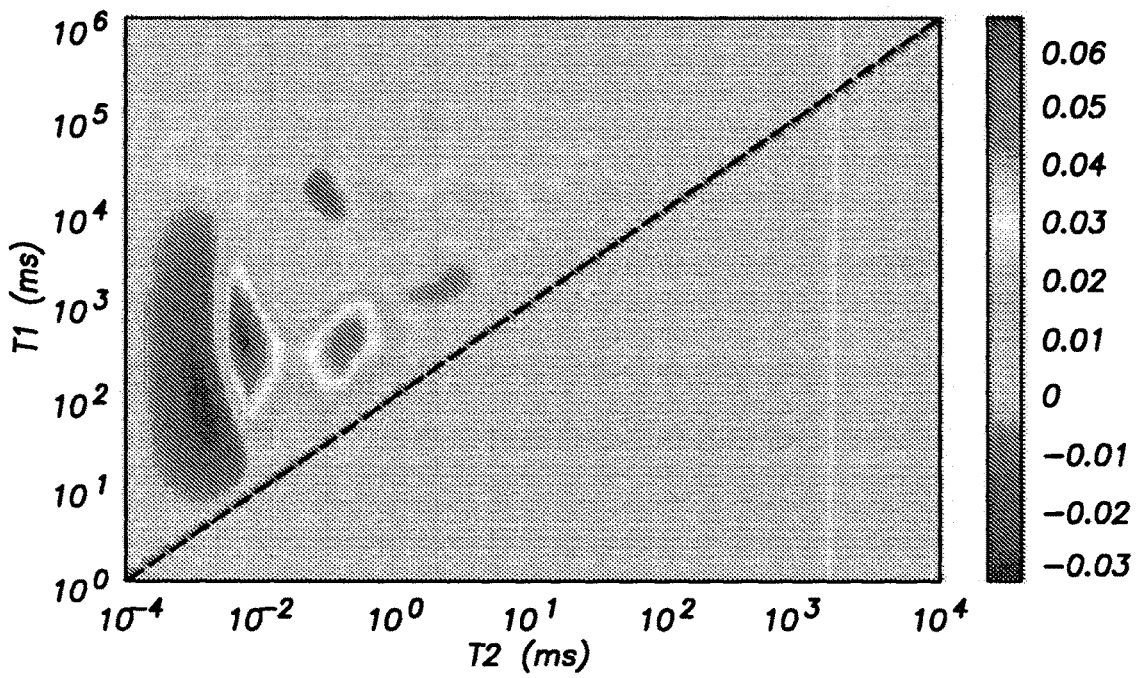
FIG.13C2

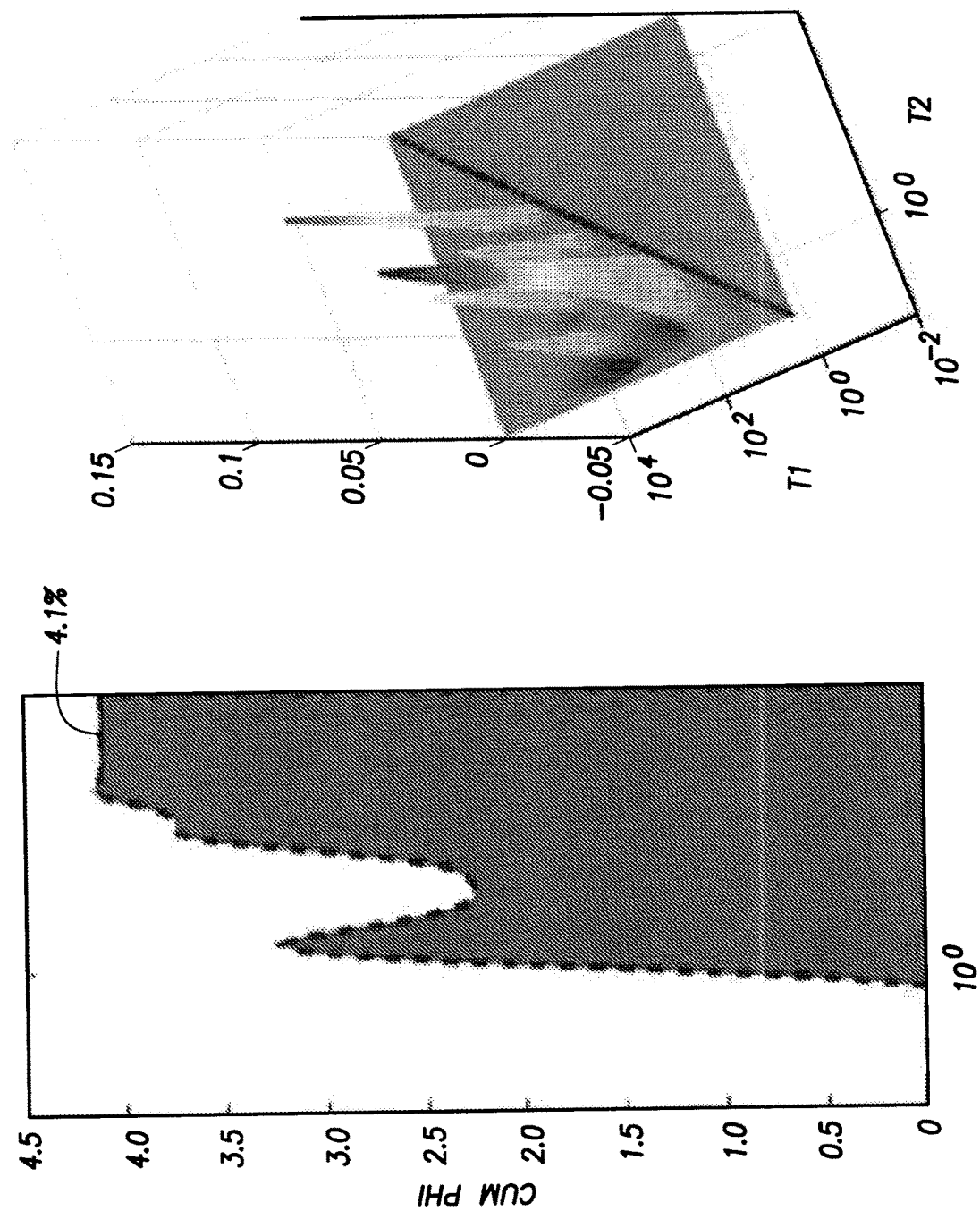

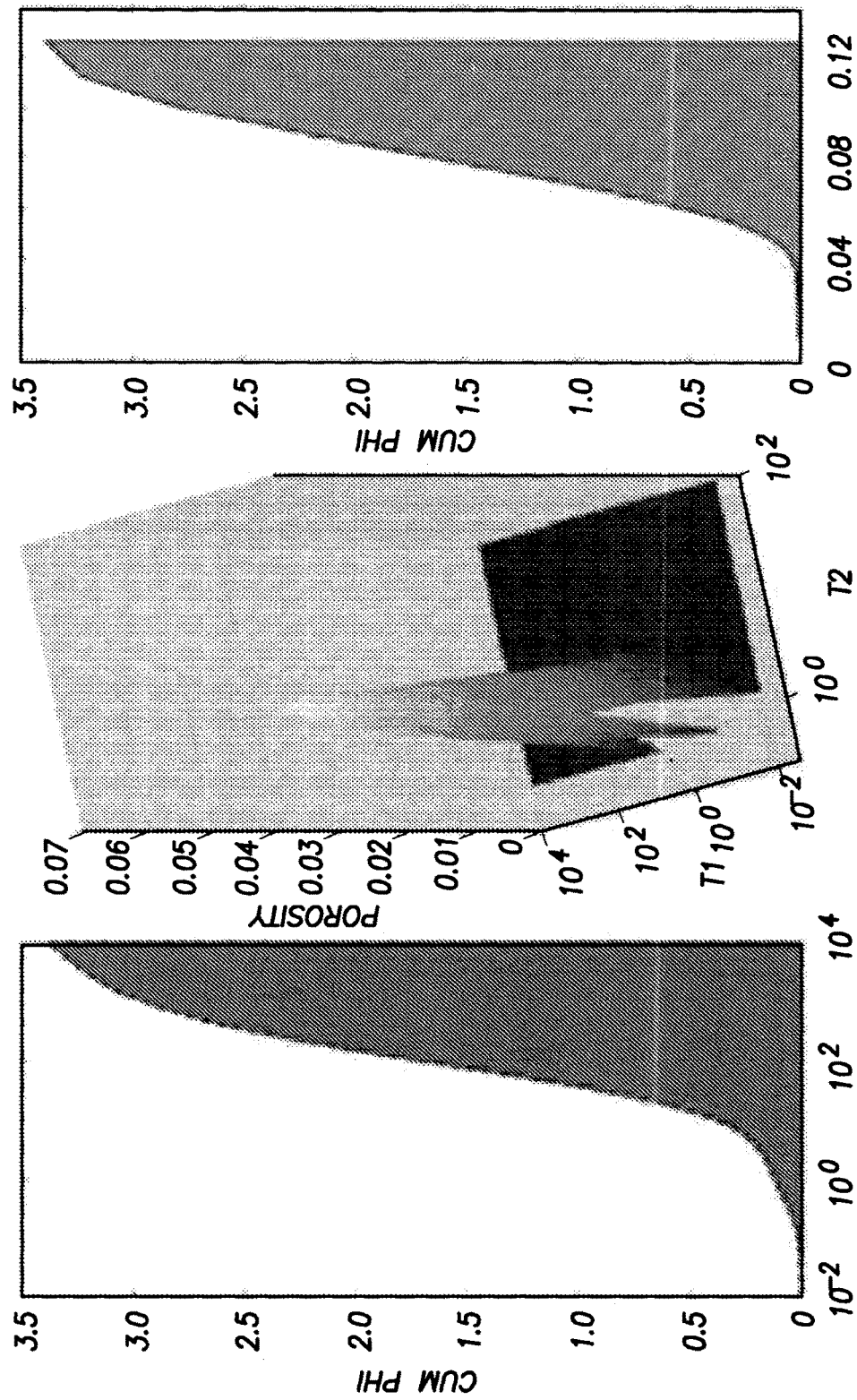

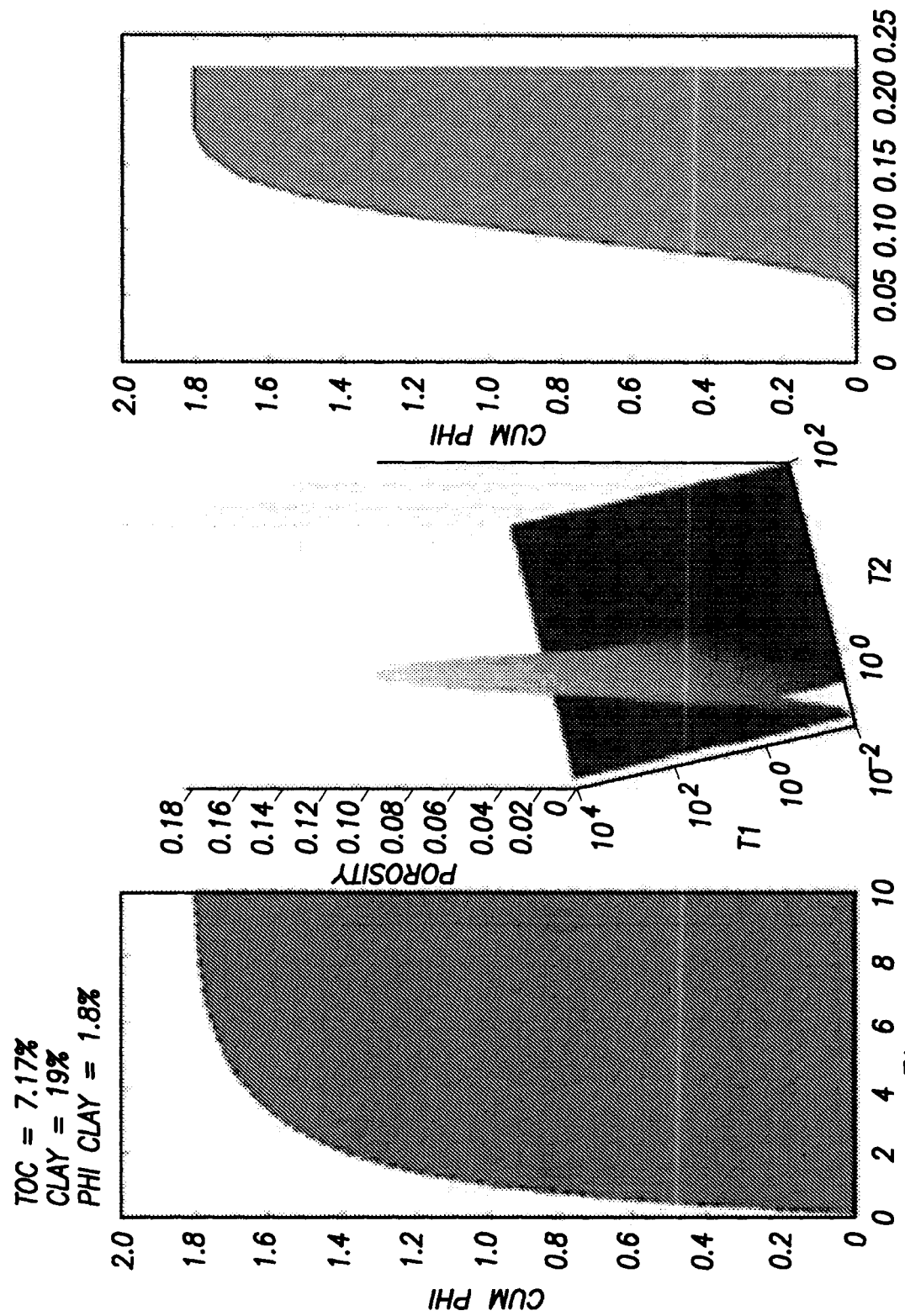

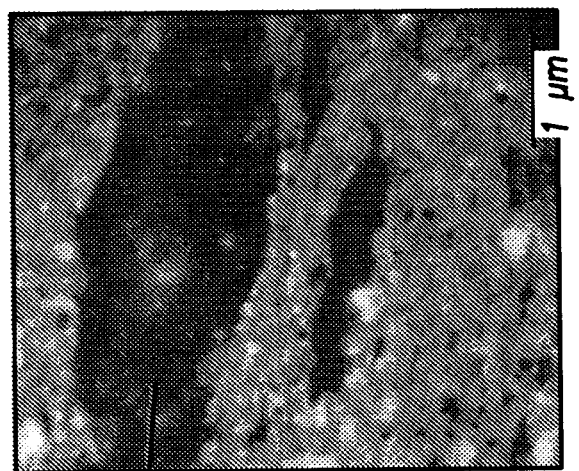
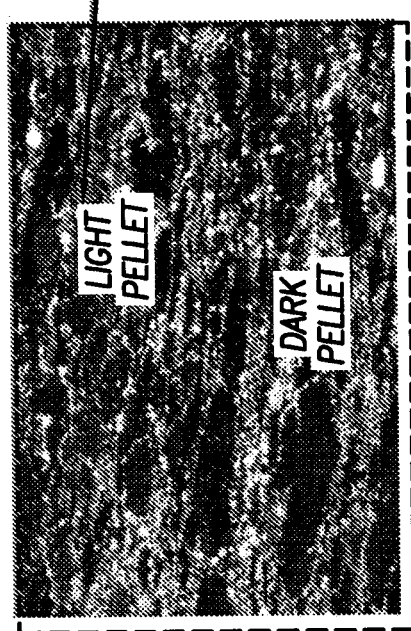
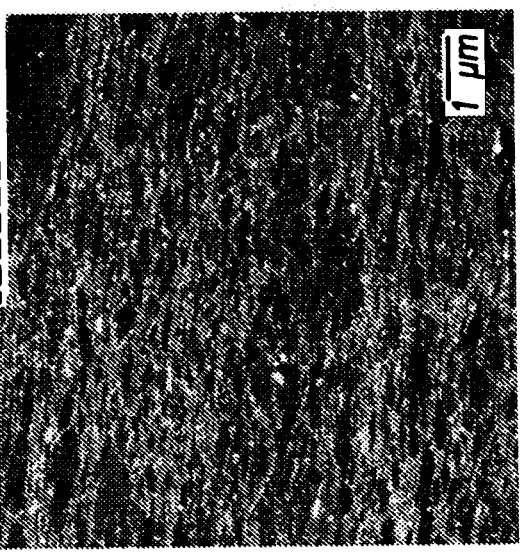
FIG. 18C
FIG. 18B
FIG. 18A

NMR SEQUENTIAL FLUID CHARACTERIZATION

CROSS REFERENCE TO RELATED APPLICATIONS

This application is the National Stage of International Application No. PCT/US2016/063440, filed Nov. 23, 2016, which claims the benefit of U.S. Provisional Patent Application No. 62/259,347, filed Nov. 24, 2015, and U.S. Provisional Patent Application No. 62/371,876 filed Aug. 8, 2016. The foregoing applications are incorporated herein by reference.

BACKGROUND

Core analysis methods such as Routine Core Analysis ("RCA") or Mercury Injection Capillary Pressure ("MICP") can be used to determine porosity and water saturation in conventional oil drilling processes. Both methods, however, demonstrate problems when measuring reservoir porosity and fluid saturation in tight rock or unconventional plays. To address these problems, the Gas Research Institute ("GRI") developed a core analysis method that measures total water and includes the step of crushing sample before cleaning.

In the GRI core analysis, intact rock undergoes mercury immersion to determine bulk volume. To estimate bulk volume from as-received bulk density and obtain oil volume, formation rock is then crushed and cleaned with toluene over a period of one to two weeks. The crushed rock is then dried and flooded with helium. With more surface area exposed through crushing, porosity measurements can provide an estimate of bulk volume hydrogen ("BVH").

Recently, GRI core analysis of unconventional plays has shown to provide inconsistencies. Therefore, while the GRI core analysis has become a primary core analysis of unconventional resources, there remain drawbacks to using this methodology for formation analysis. First, only total porosity and water saturation are quantified. Hydrocarbon saturation or movable components are not. Hence, the volume of hydrogen and other components must be determined through a series of mass balance equations and are not measured. Second, toluene is used to clean crushed sample and does not remove all hydrocarbons. This processing leads to inaccurate measurements as well total porosity and water saturation measurements that often do not match actual well performance. Porosity of formations can be underestimated as high as 100 percent. Third, attempts to standardize the GRI core analysis have failed.

Accordingly, a need exists for methods to determine reservoir porosity, fluid saturation (water and other fluid components) and grain density in conventional and unconventional plays that avoid procedural and operational inconsistencies of current core analysis.

SUMMARY OF THE INVENTION

Methods are provided for determining location of hydrocarbon in unconventional plays comprising the steps of: (a) receiving a sample from a reservoir; (b) performing an NMR measurement on the formation sample to acquire a first NMR data set; (c) drying the sample to form a dried sample; (d) performing an NMR measurement on the dried sample to acquire a second NMR data set: (e) saturating the dried sample with a fluid to form a saturated sample; (f) performing an NMR measurement on the saturated sample to acquire a third NMR data set; and (g) analyzing the first NMR data set, the second NMR data set and the third NMR data set to obtain at least one formation property or one component, wherein the formation property or the component is used to locate an oil or gas reservoir or well, and/or complete the well. The formation property or component can be total porosity, moveable fluid porosity, capillary bound fluid porosity, clay bound fluid porosity, residual hydrocarbon, and/or heavy hydrocarbon. In the present methods, the first NMR data set can be an as received sample matrix. The second NMR data set can be a dry sample matrix, and the "as received" sample matrix minus the "dry" sample matrix represents one or more of the following: capillary bound fluid, clay bound water, residual hydrocarbon and/or capillary bound porosity. Furthermore, in the present methods, the third NMR data set can be a saturation sample matrix and the saturation sample matrix minus the dry sample matrix can be used to identify and quantify mobile hydrocarbon.

In addition, methods of sequential fluid characterization provided herein can comprise the steps of: obtaining a sample from a reservoir; acquiring a first set of high resolution NMR data on the sample; drying the sample to produce dried sample; acquiring a second set of high resolution NMR data on the dried sample; determining residual hydrocarbon, heavy hydrocarbon and capillary bound porosity based on the first and the second sets of NMR data; and commencing oil and/or gas production based on the determination of the heavy hydrocarbon and/or the residual hydrocarbon.

Furthermore, the methods of sequential fluid characterization can comprise the steps of: obtaining a sample from a reservoir; drying the sample to produce dried sample; acquiring a first set of high resolution NMR data on the dried sample; saturating the sample with a fluid; acquiring a second set of high resolution NMR data on the saturated sample; and determining movable porosity based on the first and the second sets of NMR data; and commencing oil or gas production based on the determination of the heavy hydrocarbon and/or the residual hydrocarbon. In addition, methods of sequential fluid characterization comprising the steps of: obtaining a sample from a reservoir; acquiring a first set of high resolution NMR data on the sample; drying the sample to produce dried sample; acquiring a second set of high resolution NMR data on the dried sample; determining movable porosity based on the first and the second sets of NMR data; and commencing oil or gas production based on the determination of the heavy hydrocarbon and/or the residual hydrocarbon.

DESCRIPTION OF THE DRAWINGS

FIG. 4 shows the polarization that causes the alignment of the particles as a magnetic field is applied which is recorded as T1.

FIGS. 12A1, 12A2, and 12A3, 12B1, 12B2, 12B3, 12C1, 12C2, and 12C3 are two and three dimensional ("3D") plots that show high resolution NMR results of sample as received—after drying (FIGS. 12A1, 12A2, and 12A3), after brine imbibition-after drying (FIGS. 12B1, 12B2, and 12B3) and after imbibition-as received (FIGS. 12C1, 12C2, and 12C3) and as applied in sequential fluid characterization described herein.

FIGS. 13A1 and 13A2, 13B1 and 13B2 and 13C1 and 13C2 are two dimensional ("2D") and 3D representations of the "as received" sample matrix minus the "dry" sample matrix using SFC matrix processing which show capillary bound fluid removed after heating used to determine capillary bound porosity.

FIGS. 14A, 14B and 14C are 2D and 3D representations identified residual and moveable hydrocarbon as processed from SFC methodology herein showing movable porosity as equal to brine imbibition and residual hydrocarbon.

FIGS. 15A, 15B, 15C, 15D, 15E, and 15F are 2D and 3D representations showing a clear correlation to clay from lithologic determinations to SFC clay bound water, meaning associated clay bound water can be clearly identified using SFC matrix methodology.

FIGS. 18A, 18B and 18C are images taken from the Tow Creek bench in the Sand Wash basin.

DETAILED DESCRIPTION

Figure 1:
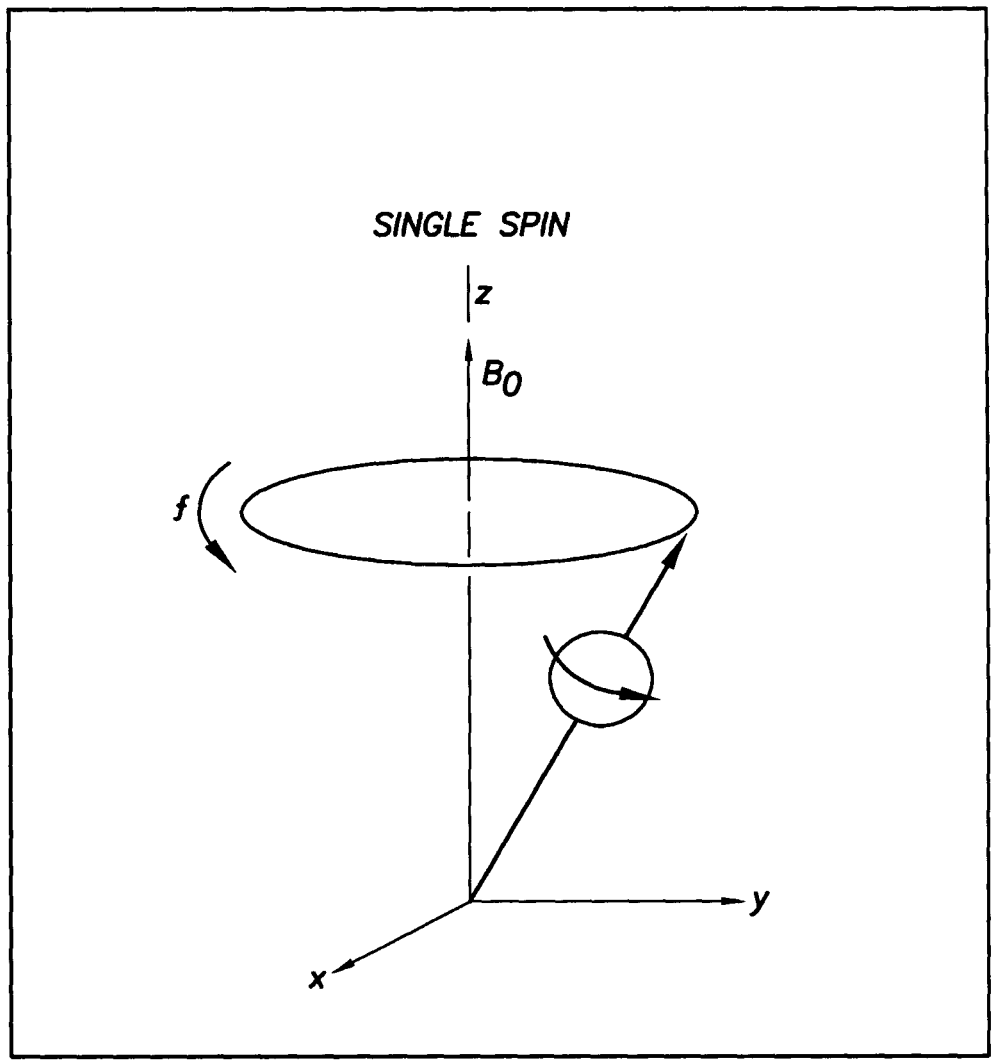
FIG. 1 is a schematic illustrating the spinning of atomic particles as well as the altering of the spin of the particles when they are polarized.

Provided herein are methods for characterizing pore fluids and nano-pores by measuring hydrogen with high resolution nuclear magnetic resonance ("NMR"). The present methods provide a step by step analysis for fluid typing and allow for maturity determinations without Vitrinite reflectance. As noted above, a key problem in traditional core analysis is the cleaning step. This is particularly prevalent in small pore throat core analysis. Furthermore, standard NMR techniques used in logging are aimed at matching downhole NMR logs and not measuring porosity or fluid components. At standard resolution, NMR cannot resolve constituents of porosity. On the other hand, as described herein, we have shown that high resolution NMR not only reduces data acquisition times to 0.1 milliseconds, but provides accurate porosity values and fluid component identification.

As such, provided herein are methods of core analysis which utilize high resolution nuclear magnetic resonance to analyze formations and reservoirs for porosity and formation fluid components. The present methods can be used in drilling and drilling operations, and in locating oil and gas reserves and/or reservoir evaluations and management. High resolution NMR is un-affected by cleaning efficiencies. Hence, the present methods and systems are useful for overcoming discrepancies between petrophysical measurements and production performance and to avoid them.

Oil and natural gas reserves are an amount of technically and economically recoverable oil and/or natural gas. Reserves may be for a well, for a reservoir, for a field, for a nation or even for the world. Different classifications of reserves are related to their degree of certainty. For example, the total estimated amount of oil in an oil reservoir including both producible and non-producible oil, referred to as oil "in place." However, because of reservoir characteristics and limitations in petroleum extraction technologies only a fraction of this oil can be brought to the surface—and it is only this producible fraction that is considered to be reserves. The ratio of reserves to the total amount of oil in a particular reservoir is called the recovery factor. Determining a recovery factor for a given field depends on several features of the operation, including method of recovery used and technological developments. To assess the level of hydrocarbon in a reserve can affect the recovery factor and the estimated valve of the reserve.

The present methods and associated systems are sometimes generally referred to herein sometimes as Sequential Fluid Characterization ("SFC"). Sequential fluid characterization can be utilized to determine a target well and well locations. These systems and methods also useful to determine location(s) for well completion. The present methods and systems are further useful to calculate the number of barrels of oil and/or cubic feet of hydrocarbon gas in a reserve and can be applied in assessments of the financial value of a reserve.

SFC has several advantages over prior art core sample analysis (also referred to herein as formation sample analysis or reservoir sample analysis). First, these methods rely on NMR measurements of the hydrogen atoms, without involving other nuclei such as carbon. The NMR signal of carbon is weak and, as such measurements of hydrogen provide for a faster analysis than compared to techniques that measure carbon. Second, the present methods allow for the use of standard equipment, as opposed to the multi-frequency probes that are needed for measurements that require two different nuclei, such as $^1H$-$^{13}C$. Third, unlike prior art methods, the present methods are capable of distinguishing movable and bound fractions of water (i.e. capillary bound, clay bound and moveable water) from total water and can differentiate hydrocarbon materials based on viscosity and molecular structure in order to distinguish such materials. Fourth, the present methods can utilize bulk measurements such as provided by with Fourier transform infrared spectroscopy ("FTIR"). Fifth, the present methods provide for quantification of porosity and fluid components and offer field development efficiencies unlike prior art methods. Six, the present methodologies are nondestructive, non-invasive, and do not necessitate the crushing of the sample or separation of the organics from the sample.

According to one aspect, the core analysis described herein includes the step of measuring formation properties using high resolution nuclear magnetic resonance ("NMR") spectroscopy to acquire NMR data. The acquired NMR data is then analyzed to determine one or more properties of a formation. The NMR data acquired include $T_1$ and/or $T_2$ relaxation times. In addition, the sequential fluid characterization systems and methods are capable of detecting NMR signals with echo times of less than 200 microseconds.

Formation properties measured in the present systems and methods include: (1) total porosity; (2) porosity for each of moveable fluid: (i) capillary bound fluid, (ii) clay bound fluid and (iii) heavy hydrocarbon; (3) total organic carbon content; and (4) water saturation. As used herein, capillary bound porosity measure fluids including water held within pores by capillary forces. The capillary bound fluid is non-moveable and generally occupies pore linings. Clay bound fluid or clay bound water means and includes water or other fluid within a clay lattice or near the surface within the electrical double layer that does not move when fluid is flowed through the rock. Essentially, the fluid/water fills pore space within day. Clay bound porosity is a representation or measurement of the amount of clay bound fluid. Moveable fluid porosity is a representation or measurement of porosity of the fluids not bound by capillary forces and can include hydrocarbons and water. Residual hydrocarbon porosity is a measurement of residual hydrocarbon that remains in the pore space due to drop in relative permeability to hydrocarbon and indicates the hydrocarbons still in the sample. The term heavy hydrocarbon represents hydrocarbons having high viscosity (tar like or bitumen) that are typically not moveable. Heavy hydrocarbons are bound in micro pores. Moveable fluids can include water, hydrocarbon and any other fluid or phase that can exist in pores, the composition of which is not relevant in the determinations made by SFC, because moveable fluid represents porosity.

Generally, in NMR measurement, a magnetic field is applied to the nuclei of the atoms, not the electrons. Subatomic particles can be imagined to be spinning on an axis. See e.g., FIG. 1. When a NMR measurement is performed, the spin of these subatomic particles is altered thereby changing the net spin of the nuclei. The polarization of these nuclei and their relaxation in relation to spinning is what is measured by the NMR system and each element has a specific spectrum that correlates to its spin.

Figure 2:
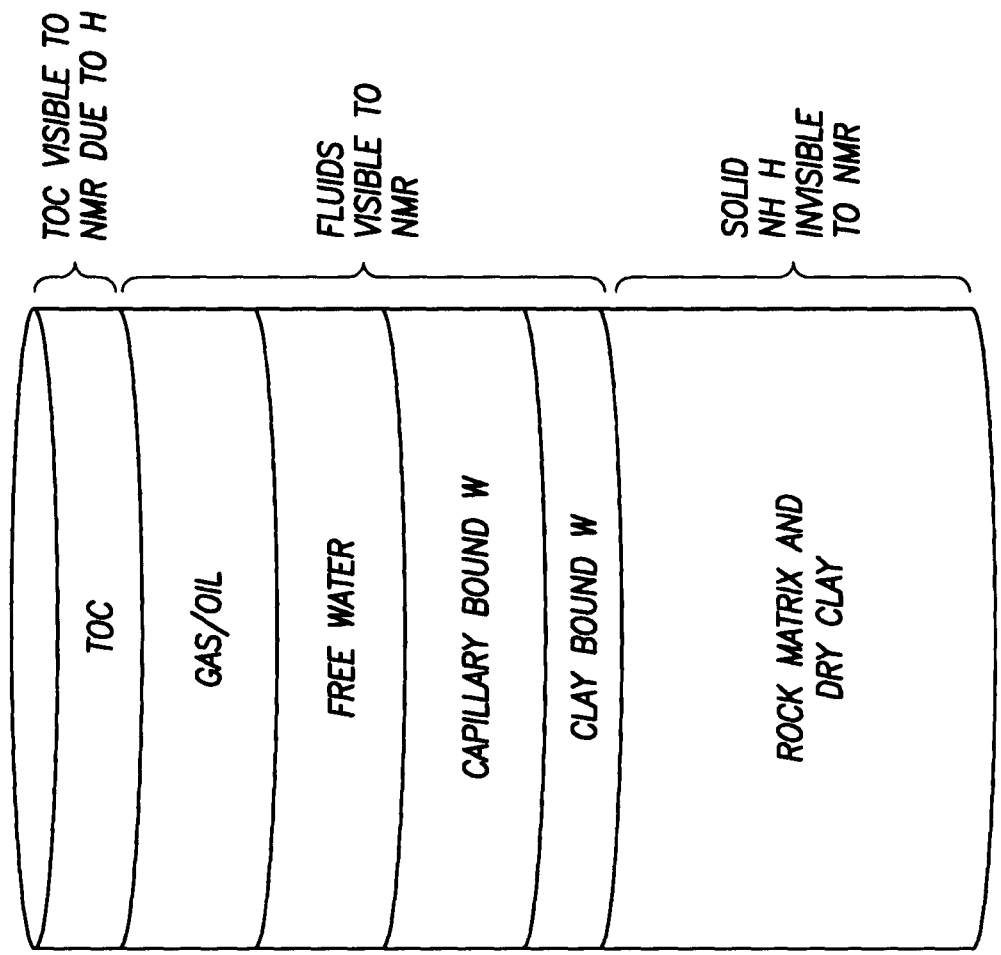
FIG. 2 is an illustration showing the components visible and not visible to oil field NMR. TOC, water, and hydrocarbon all contain hydrogen and are therefore visible in the oil field NMR spectrum. The rock matrix, in general, does not contain hydrogen and is not visible to the oil field NMR spectrum.

While NMR spectroscopy can be used to measure the spin of most atoms, its use in connection with geological formations has only been for conventional plays. Hydrogen is a component found in most fluids (i.e., hydrocarbon and water) contained within the geological formation. NMR can observe components that only contain hydrogen, but cannot observe or "see" other components of porosity that do not contain hydrogen (i.e. carbon dioxide ($CO_2$)). So while components of a geological formation containing hydrogen will be visible to the NMR system, solid rock matrix and dry clay will not. FIG. 2.

Figure 3:
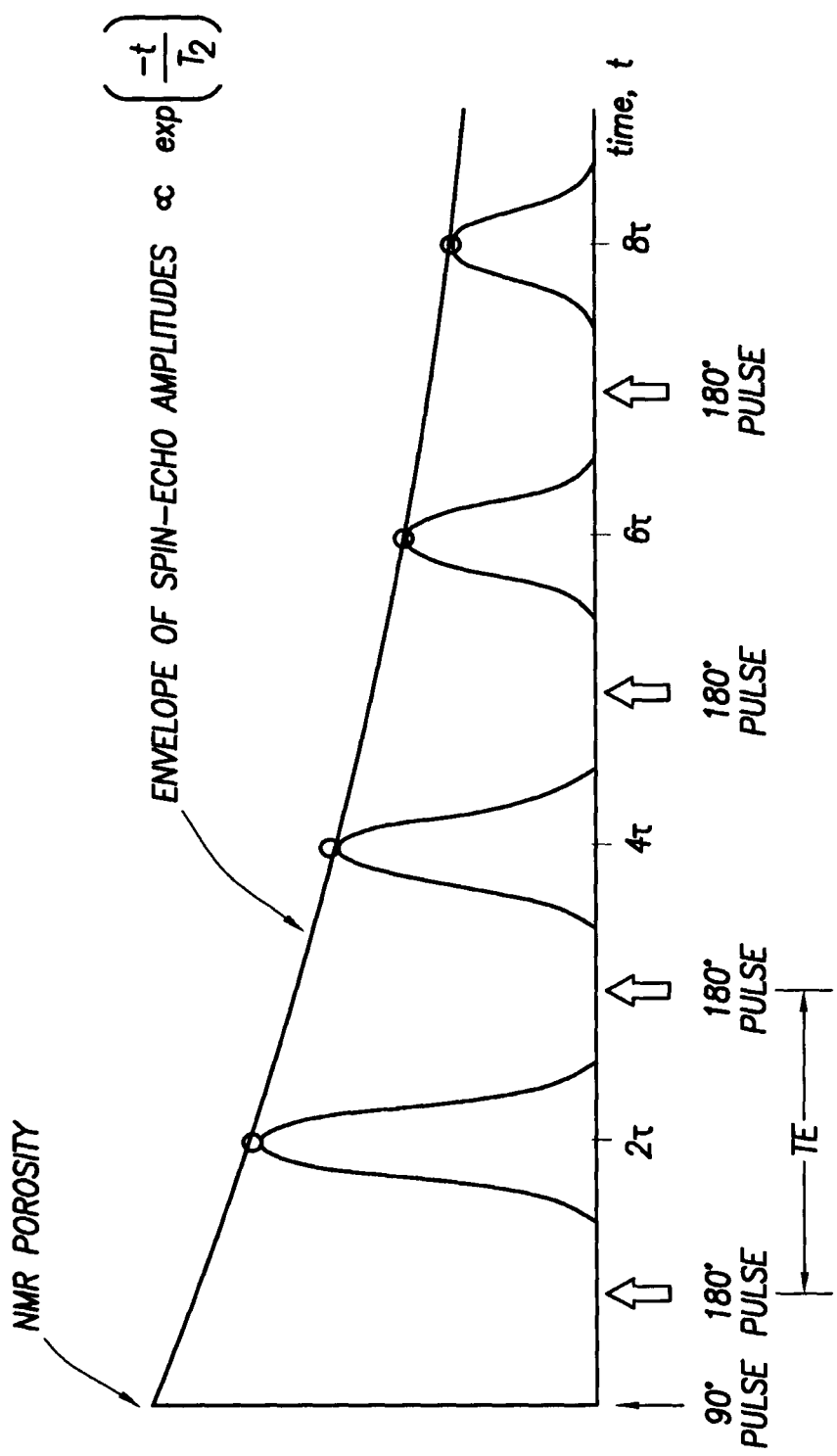
FIG. 3 is a schematic illustrating the effect of inter-echo spacing (TE) on interpreted NMR porosity.

Hence, only components of a reservoir containing hydrogen are visible to the NMR spectrometer with the exception to the solid rock matrix and dry clay. In order to create the spin necessary for NMR spectroscopy, a magnetic moment needs to be created around the sample. The magnetic moment is the force the magnet can exert on electric currents and torque that a magnetic field will exert on the object (protons). Curie's Law calculates the magnetic moment per unit volume in oil field NMR spectroscopy and approximates the number of hydrogen that can be then translated to porosity using proper calibration as shown in Equation 1 below:

$$M_0 = NB_0(\gamma^2 \hbar^2 I(I+1))/(3(4\pi^2)kT) \quad \text{(Equation 1)}$$

where N=the number of protons under observation per unit volume, $\gamma$ is the gyromagnetic ratio for the proton under observation, h is Planck's constant, I is the spin quantum number of the nucleus under observation, k is Boltzman's constant and T is the absolute temperature (Kelvin). $M_0$ is therefore proportional to the number protons (for e.g., hydrogens) and the applied magnetic field $B_0$. The presence of external strong permanent magnetic field (Bo) polarizes hydrogen atoms (protons) in the rock, which is called T1 polarization or longitudinal relaxation (Equation 1). Hydrogen atoms in different fluids polarize at different T1 times and if the wait time ("TW") is long enough total T1 polarization also corresponds to total porosity (FIG. 3)

After complete polarization, a 90° pulse is applied to hydrogen protons to tip them in a transverse plane. This tipping is accomplished by applying an oscillating magnetic field ("B1") perpendicular to Bo. When oscillating field B1 is turned off, the proton population begins to diphase and the signal decays quickly in a transverse plane as protons lose phase coherency. This decay of signal in transverse plane is termed as T2 relaxation (or transverse relaxation) (FIG. 4).

The dephasing and difficulty in measurement can be reversed by applying series of 180° pulses after initial 90° tipping pulse of an oscillating field at certain time intervals. After the pulses are applied, proton re-phasing occurs and a detectable signal is generated at a receiver coil, which is called spin echo. As time over which an oscillating field is applied (τ) the de-phasing time is then equal to re-phasing time and spin echo peak occurs at time 2τ which is defined as Inter-Echo spacing ("TE") (FIG. 3). FIG. 4 shows the polarization that causes the alignment of the particles as a magnetic field is applied which is recorded as T1. T1 is the amount of time it takes to polarize protons in a longitudinal plane. The amount of time it takes for the protons to relax back to a stable state in a transverse plane is T2 relaxation. Each component of the reservoir fluid is visible to the NMR polarizes and relaxes at known and distinctive paths (Coates and others, 1999)

Figure 5:
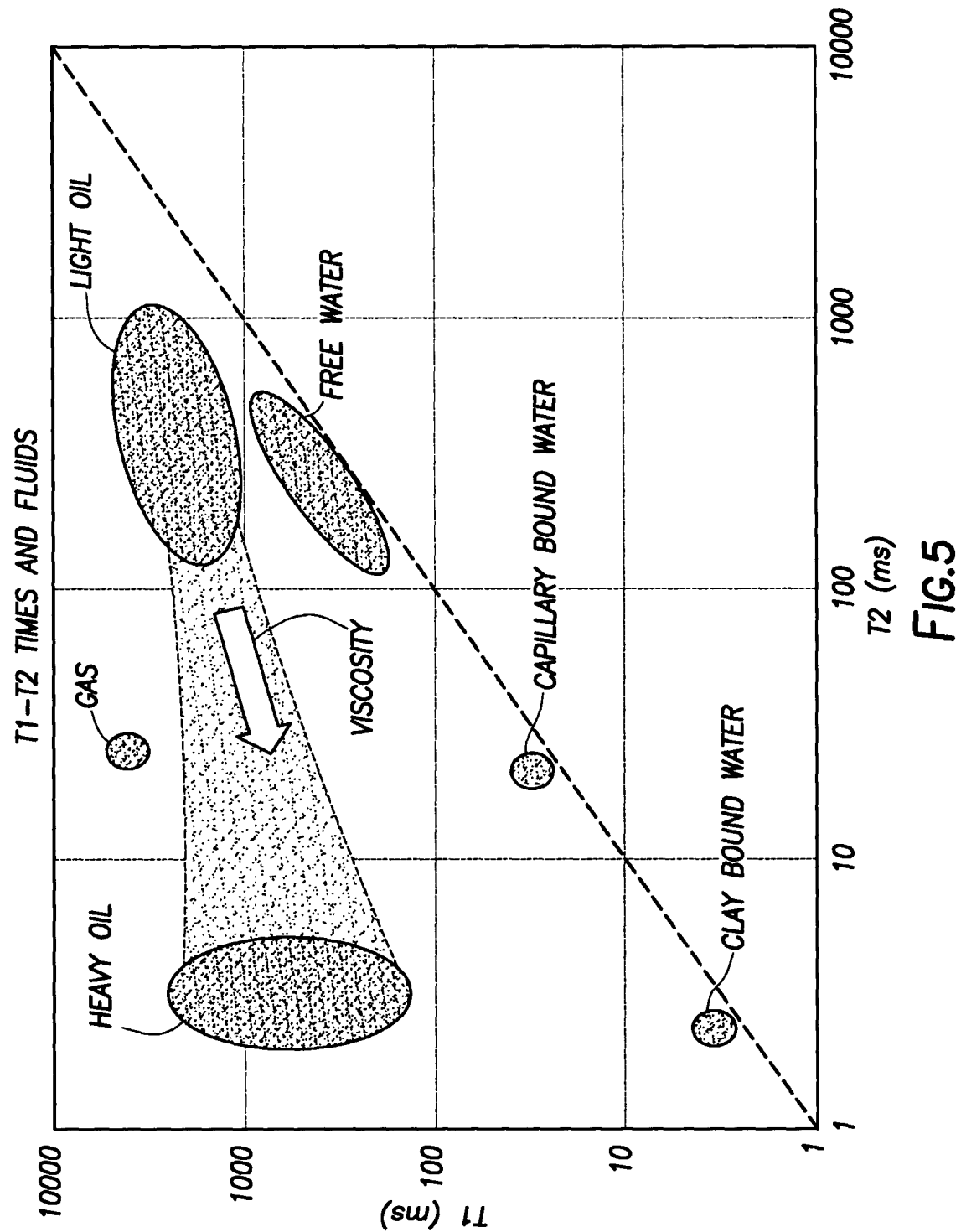
FIG. 5 shows a response of hydrogen bearing components in a reservoir from the T1 and T2 decays.

Each fluid that contains hydrogen has characteristic response to an applied magnetic field in the way it polarizes or decays (FIG. 5) which mainly depends upon three factors: (1) the size of pore these fluids residing in (2) the chemical composition and viscosity of fluid; and (3) the diffusivity of fluids. A borehole fluid response to NMR T1-T2 (polarization and relaxation), for example, is illustrated in FIG. 5. Note the viscosity change of hydrocarbons with changing T2 times. Ozen, A. E., et al., *T1/T2 NMR Surface Relaxation Ratio for Hydrocarbons and Brines in Contact with Mature Organic-Shale Reservoir Rocks*, Petrophysics Vol. 54, p. 11-19 (2013); Jiang, T., et al., *Integrated Petrophysical Interpretation of the Eagle Ford Shale with 1-D and 2-D Nuclear Magnetic Resonance (NMR*, 54$^{th}$ SPWLA Annual Logging Symposium, June 2013; Kausik et al, *NMR Relaxometry in Shale and Implications for Logging*, 56$^{th}$ Annual SPWLA Logging Symposium, July 2015; and Mansoor, R. A., et al., *Characterizing Light Versus Bound Hydrocarbon in Shalre Reservoir by integrating New Two-Dimensional NMR and Advanced Spectroscopy Measurements*, URTEC 2016 San Antonio.

For subject methods, after the protons have been completely polarized by the applied magnetic field, an NMR measurement can be made by exciting the aligned protons away from complete polarization. This is done with an RF pulse (also called an oscillating field or the $B_1$ field) produced by a probe. The probe is usually a coil of wire although other geometries may be used and the geometry is not of particular importance to the measurement. The maximum measured signal is obtained when the nuclei are rotated 90° away from the applied magnetic field. A pulse that rotates the magnetization 90° is referred to as a 90° pulse. The rotation caused by the RF pulse is a combination of power and duration of the RF pulse and varies from equipment to equipment. The magnetic moments of the nuclei precess around the applied magnetic field and are referred to as "spins". The rate of precession is a combination of the type of nuclei under observation, the applied magnetic field, and the nuclear and electric interactions the nuclei in the sample may be undergoing. This precession induces a voltage in the coil (i.e. a change of magnetic field will induce a change of current in a coil, leading to a voltage) which can be used to determine porosity. There may be a dead period after an RF pulse where magnetization cannot be measured because there is also "ringing" in the coil due to the produced RF pulse. The length of this dead period is also equipment dependent.

There are two ways NMR signals relax after excitation: $T_1$ and $T_2$ relaxation. $T_1$ (also called spin-lattice relaxation or longitudinal relaxation) describes the time it takes for the magnetic moment of nuclei to align along the applied magnetic field after first being placed in the magnetic field or the time required to regain longitudinal magnetization following an RF pulse. $T_1$ is determined by interactions between the resonating protons and their environment ("lattice") that allow the energy absorbed by the protons during resonance to be dispersed in the lattice. Different fluids, such as water, oil and gas, will each have different $T_1$ relaxation times as shown in FIG. 4.

$T_2$ relaxation (also known as spin-spin relaxation or transverse relaxation) is a measure of how long the precessing spins take to go from a coherent state to a disordered state. $T_2$ decay is due to magnetic interactions that occur between the spins, each other and their environment. In contrast to $T_1$ interactions, $T_2$ interactions involve a phase change and thus a loss of coherence between spins rather than a transfer of energy. Initially after excitation, all the spins precess in unison around the applied magnetic field. As time goes on, the spins interact with each other and their environment and therefore get out of sync. The time it takes for the spins to lose their coherency and lose order in their precession around the applied magnetic field is the $T_2$ time. $T_1$ and $T_2$ relaxation events occur simultaneously but $T_1$ must be longer than or equal to the $T_2$ time. In some cases, such as in solids, the $T_1$ time is significantly longer than the $T_2$ time.

There is also an additional type of $T_2$ relaxation called $T_{2*}$ relaxation. This is additional dephasing of the spins due to time invariant magnetic field inhomogeniities caused by things such as magnet inhomogeneity, dipolar coupling, and chemical shift. Unlike $T_2$, $T_{2*}$ relaxation is reversible and can be reversed with a range of different pulse sequences such as a spin echo or a solid echo.

When fluids are inside a porous material, such as a sample (also referred to herein sometimes as a "core sample," a "formation sample" or a "reservoir sample"), the relaxation time of the bulk fluid is enhanced by contact with pore surfaces. This will hold true for both $T_1$ and $T_2$ relaxation processes. In smaller pores, the fluid will encounter the pore surface more frequently than in larger pores. This means that fluid inside small pores will have a bulk relaxation time that is faster than that of fluid inside large pores. The general basic relation to correlate for the measured $T_1$ or $T_2$ is given by:

$$1/T_{1,2} = \rho_{1,2}(S/V)$$

where S and V are pore surface and volume, $T_{1,2}$ is the relaxation time for longitudinal and transverse magnetization respectively and $\rho_{1,2}$ is the surface relaxtivity.

Surface relaxivity corresponds to how effective the surface is in enhancing the relaxation of the fluid and depends on the lithology of the formation and the amount of paramagnetics in the samples. In addition, the $T_2$ relaxation will have additional influence from the presence of internal gradients as defined by the following equation:

$$1/T_2 = 1/T_{2Bulk} + \rho_2(S/V) + D(\gamma Gte)^2/12$$

where γ is the gyromagnetic ratio for the nuclei under observation, D is the diffusion coefficient, G is the constant magnetic field gradient, and te is the inter-echo spacing. FIG. 5 depicts an ideal borehole fluid response to NMR T1-T2 times.

Thus, each fluid that contains hydrogen will have a characteristic response to a magnetic field in the way it polarizes or decays, as shown in FIG. 3, and which will mainly depend upon three factors: 1) size of pores the fluids reside in; 2) the chemical composition and viscosity of the fluids; and, 3) the diffusivity of fluids. Diffusivity is the rate at which particles/fluid can spread with in the pore space. It is a normal concern in larger pore systems because fluids have more freedom to move within the pore space. In tighter pores (nano or Micro) particles and fluid have a low degree of freedom to diffuse. Therefore, in the present methods, a range of pore sizes are not needed as diffusivity is based on Te and gas. We are imbibing with water, and potential effects of diffusivity are minimized. For this reason, a diffusivity measurement is not necessary in connection with the present sequential fluid characterization methods and systems. Similarly, the present methods and systems do not require knowledge of chemical composition of fluids.

To perform the technique of the present disclosure at least two NMR measurements are required and depending on the formation property, three sets of NMR measurement are utilized. A first NMR measurement is performed on a sample (also referred to as a sample, a formation sample and/or a reservoir sample) as received. These NMR measurements collectively referred to herein sometimes as "as received" NMR data. A second NMR measurement is taken after the sample has been dried. These NMR measurements (after drying) collectively referred to sometimes as "dry" NMR data. A third NMR measurement is taken after the dried sample has been saturated with a fluid, such as brine. These NMR measurements (after saturation) collectively referred to sometimes as "saturated" NMR data. Each NMR measurement records a response. For example, $T_1$ relaxation or $T_2$ relaxation of the constituents containing hydrogen in the sample to a given pulse sequence is recorded. Examples of pulse sequences include, but are not limited to: an inversion recovery sequence; a saturation recovery sequence; Carr-Purcell-Meiboom-Gill (CPMG) pulse echo train; a spin echo pulse; a solid echo pulse; a solid echo train; a free induction decay pulse sequence; a diffusion measurement; a quantum filter measurement sequence; an internal gradient measurement sequence and combinations thereof.

The standard pulse sequence for measuring $T_1$ relaxation is an inversion recovery sequence. Inversion recovery starts with an initial 180° pulse to invert the magnetization to lie along the negative Z-axis. The magnetization is allowed to relax for a time $T_1$-tau ($\tau$). Then a 90° pulse is used to place the magnetization in the XY plane. The inversion recovery may be measured from the free induction decay, or off a spin echo or a solid echo. If the signal is measured off of a free induction decay, the NMR signal is recorded after the dead time following the 90° pulse. If the signal is measured off of a spin echo, a 180° pulse will be performed at a time tau ($\tau$) following the 90° pulse and the signal is measured from the resulting echo that occurs at a time tau ($\tau$) after the 180° pulse. If the signal is measured off of a solid echo, another 90° pulse will be performed at a time tau ($\tau$) following the first 90° pulse and the signal is measured from the resulting echo that occurs at a time tau ($\tau$) after the second 90° pulse. The time $T_1$-tau ($\tau$) is varied from short to long values to adequately measure the range of possible $T_1$ relaxation times for the constituents in the sample.

Another method, called saturation recovery, may also be used to measure $T_1$ relaxation. A saturation recovery sequence is characterized by numerous 90 degree pulses in short succession followed by a wait time to allow $T_1$ relaxation. The number of 90° pulses needed to adequately saturate the system is determined empirically for a given sample. The series of 90° pulses is performed to saturate the magnetization of the entire sample to an excited state. A period of time $T_1$-tau ($\tau$) is allowed to pass to allow the excited magnetization to relax via $T_1$ relaxation. After the time $T_1$-tau ($\tau$), another 90° pulse is applied. The saturation recovery signal can be measured from the free induction decay, or off a spin echo or a solid echo as described above.

$T_2$ relaxation may be measured using the Carr-Purcell-Meiboom-Gill ("CPMG") sequence. This sequence uses an initial 90° pulse to excite the sample. After the spins begin to dephase, the spins will start to interact with each other and their environment to lose coherency in their precession. Some part of this loss of unison is random, while another part of this loss is due to local magnetic field inhomogeneities. The loss of coherency due to time independent magnetic field inhomogeneity is called $T_2$ relaxation. Because the local variants in the field inhomogeneity are not random, they can be refocused. To refocus, a 180° pulse is applied at a time tau ($\tau$) after the initial 90° pulse. The spins will then start refocusing until they regain coherency at a time tau ($\tau$) after the 180° pulse to produce what is referred to as a spin echo. However, some of the signal intensity is lost due to the random true, underlying $T_2$ relaxation. After a spin echo is produced, the magnetization begins to dephase again. The magnetization can be refocused again by applying yet another 180° pulse at time 2×tau ($\tau$). This can be repeated until the magnetization has completely decayed away. By measuring the intensity of each spin echo and applying an inversion, the raw data can be converted to a distribution of T2 times for the hydrogen-containing constituents in the sample.

There is another method of measuring $T_2$ where only a single 180° pulse is used and the time between the initial 90° pulse and the 180° pulse is varied. When there is molecular diffusion through magnetic gradients, this will lead to loss in addition to the underlying $T_2$ magnetization. These magnetic gradients can arise from gradients in the applied magnetic field or due to magnetic susceptibility differences between the sample and saturating fluids. While some applications make use of this effect, in general the pulse sequence echo times will be kept as short as possible to avoid this influence on the measured signal.

A solid echo sequence is another way magnetization that is lost may be refocused. This sequence uses an initial 90° pulse to excite the sample. After the spins begin to dephase, the spins will start to interact with each other and their environment to lose coherency in their precession. If the loss of coherency is due to homonuclear dipolar coupling, they can be refocused with a solid echo. To do this, a 90° pulse is applied at a time tau ($\tau$) after the initial 90° pulse. The spins that have dephased due to homonuclear dipolar coupling will start to refocus until they regain coherency at a time tau ($\tau$) after the 90° pulse to produce what is referred to as a solid echo. However, some of the signal intensity is lost due to the random true, underlying $T_2$ relaxation. In addition, the solid echo is only able to completely refocus magnetization dephased due to homonuclear dipolar coupling for isolated spin pairs. The solid echo will be less effective at refocusing magnetization lost due to homonuclear dipolar for three or more coupled spins. After an echo is produced, the magnetization begins to dephase again. By applying yet another 90° pulse at time 2×tau, the magnetization can be refocused again. This can be repeated until the magnetization has completely decayed away, creating a solid echo train. With the solid echo train sequence, multiple solid echoes are performed in succession instead of just one. By measuring the intensity of each solid echo and applying an inversion, the raw data can be converted to a distribution of $T_2$ times for the constituents in the sample.

Another NMR pulse sequence includes application of a free induction decay pulse sequence as discussed above. A free induction decay pulse sequence is characterized by measurement of the NMR signal after the dead time following a single 90° pulse. Alternatively, the NMR pulse sequence may include application of a quantum filter measurement sequence. Common quantum filter measurements are the double quantum filter and the triple quantum filter. These are used to filter out all signals except those arising from a double quantum coherence or triple quantum coherence, respectively. In practice, quantum filters can be designed to filter for signal from a quantum coherence of any given rank. A double quantum filter begins with a 90° pulse to place the magnetization in the XY plane. The system is allowed to evolve for a time tau ($\tau$) in the presence of dipolar and j-couplings, which will lead to the creation of double quantum coherences. After a time tau ($\tau$), a second 90° pulse is applied. A 180° pulse may be inserted at time tau ($\tau$)/2 to refocus dephasing but it is not required. Finally, a third 90° pulse places the magnetization into the XY plane for measurement of the NMR signal. This measurement is repeated several times and the resulting signals are added together. The phase of the pulses are altered between the measurements such that when the signals are added together, only signals arising from the double quantum coherences remain and other signals cancel each other out. For other types of quantum filters, the angles of the pulses may be different.

A further NMR pulse sequence includes application of an internal gradient measurement sequence. An internal gradient measurement sequence involves application of a 90° pulse to place the magnetization into the XY plane. After the 90° pulse, there is a fixed period of time. Following this fixed period of time, the NMR signal is measured. During the fixed period of time, there are a varied number of 180° pulses that are applied, from as low one to as many as possible that can be performed with the equipment at hand. The decrease in signal as the number of 180° pulses decreases is used to encode for the internal gradients that are present.

Besides $T_1$ and $T_2$ relaxation times, NMR pulse sequences may be used to measure the diffusion coefficient of the hydrogen-containing constituents of the sample. There are generally three ways to measure the diffusion coefficient. The first is a pulsed field gradient spin echo sequence which uses a 90° pulse to excite the sample. A transient magnetic field gradient is then applied to the system for a time $\delta$ to impart a phase shift to the precessing spins. The gradient is turned off and a period of time is allowed to pass to allow the spin bearing molecules to diffuse. A 180° pulse is then applied and again, a period of time is allowed to pass to allow the spin-bearing molecules to diffuse. A transient magnetic field gradient is applied to the sample for a time $\delta$ to again impart a phase shift to the precessing spins. The second gradient will serve to refocus the magnetization from spin bearing molecules that have not moved since the first transient gradient, but will not completely refocus the magnetization from spin-bearing molecules that have moved since the first. This is repeated with an increased gradient strength to increase attenuation of signal. The decrease in signal as the transient gradient is applied is used to encode for the diffusion coefficient of the hydrogen-containing constituents in the sample.

The second way to measure diffusion coefficients is with the pulsed field gradient stimulated echo sequence. In this sequence, a 90° pulse is used to excite the sample. A transient magnetic field gradient is then applied to the sample for a time $\delta$ to impart a phase shift to the precessing spins. The gradient is turned off, a brief period of time is allowed to pass, and a 90° pulse is applied to restore the magnetization along the Z-axis. Again, a period of time is allowed to pass to allow the spin-bearing molecules to diffuse and another a 90° pulse is applied to return the magnetization to the XY plane. A transient magnetic field gradient is applied to the system for a time $\delta$ to again impart a phase shift to the precessing spins. The second gradient will serve to refocus the magnetization from spin bearing molecules that have not moved since the first transient gradient, but will not complete refocus the magnetization from spin-bearing molecules that have moved since the first. This is repeated with an increased gradient strength to increase attenuation of signal. The decrease in signal as the transient gradient is applied is used to encode for the diffusion coefficients of the constituents in the sample.

The third way to measure diffusion coefficients is the constant gradient variable echo spacing sequence. Here, a constant gradient is applied during the course of the measurement. A 90° pulse is used to excite the sample. There is a wait time tau ($\tau$) and a 180° pulse is used to refocus the magnetization. The value of tau ($\tau$) is varied and the decrease in signal with increased tau ($\tau$) is measured to determine the diffusion coefficient of the hydrogen-containing constituents in the sample.

We have concluded that a reservoir volumetric can be analyzed through NMR data obtained via high resolution NMR in order to determine one or more properties of formations which can be representative of the reservoir from which a sample was obtained. As described below, the present methods include sample acquisition, NMR measurement and an NMR data analysis.

Figure 6:
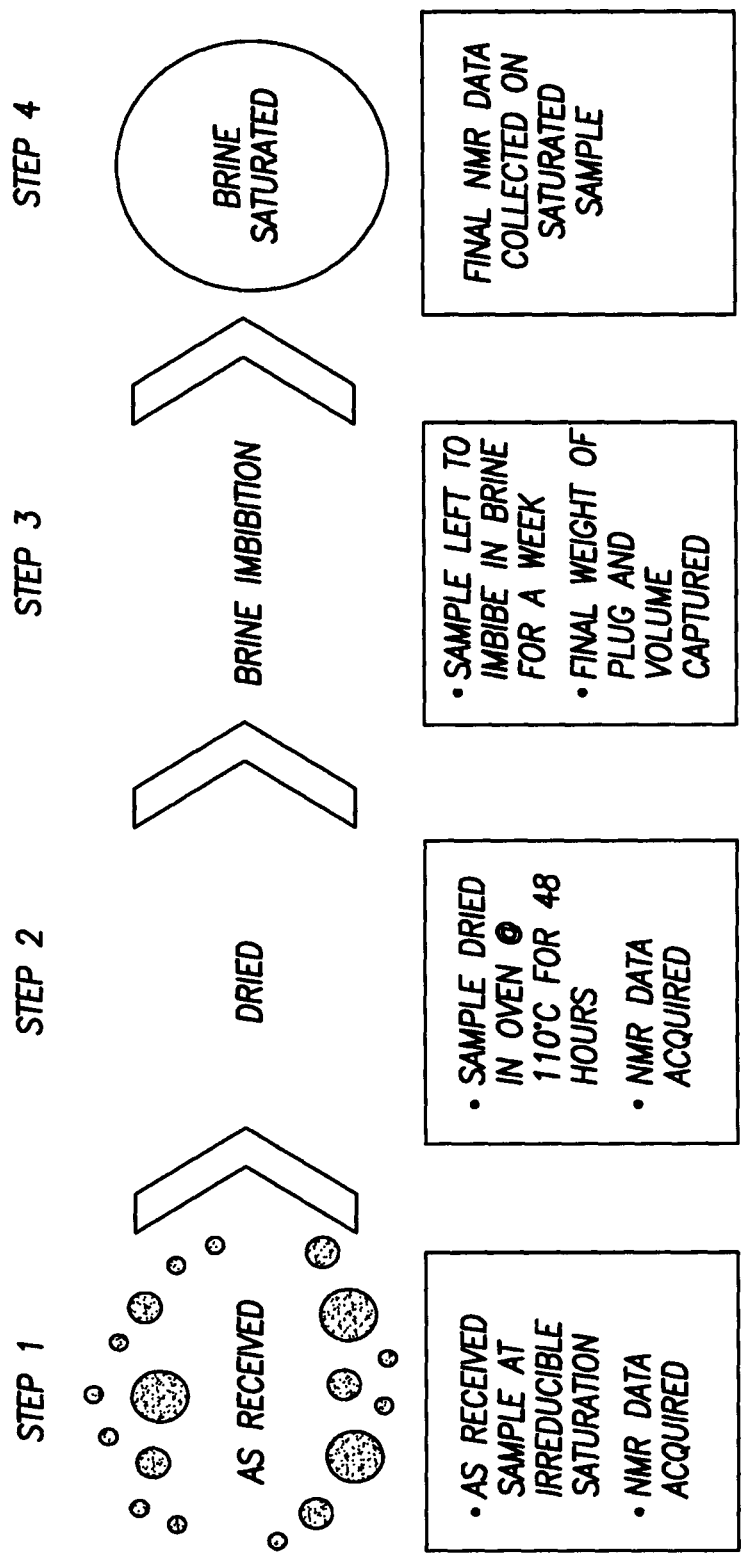
FIG. 6 is a schematic of the exemplary steps that can be used in the present analysis.

As exemplified in FIG. 6, a core sample is obtained from a formation or a reservoir and can be at irreducible saturation. In the present methods, one can use cuttings, crushed rock samples, or larger cores such as whole cores. NMR machines can utilize samples similar in size to a one inch core plug. The process of NMR is non-destructive.

Figure 9:
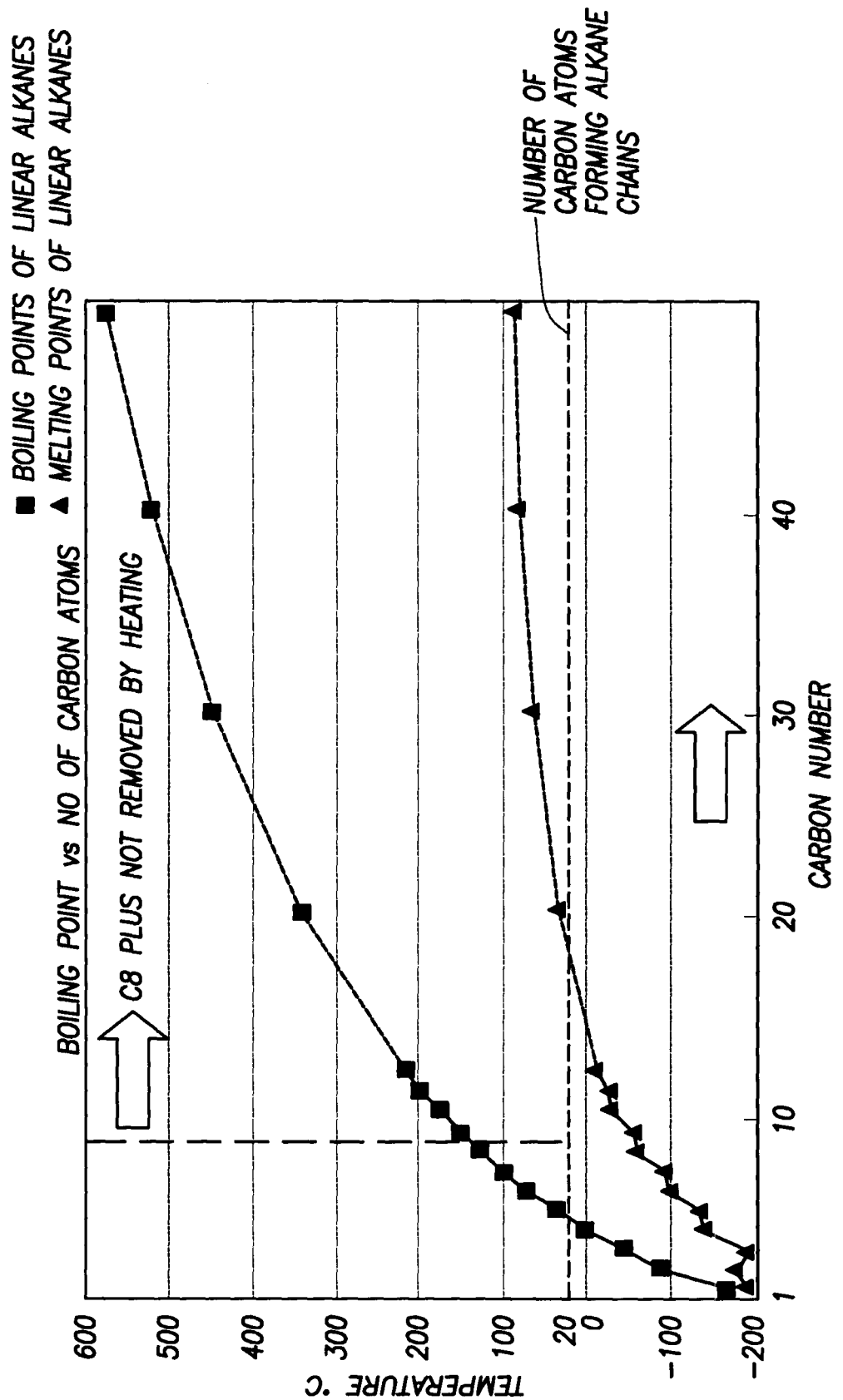
FIG. 9 is a graphic depiction of boiling versus number of carbon atoms contained in the sample.
Figure 29:
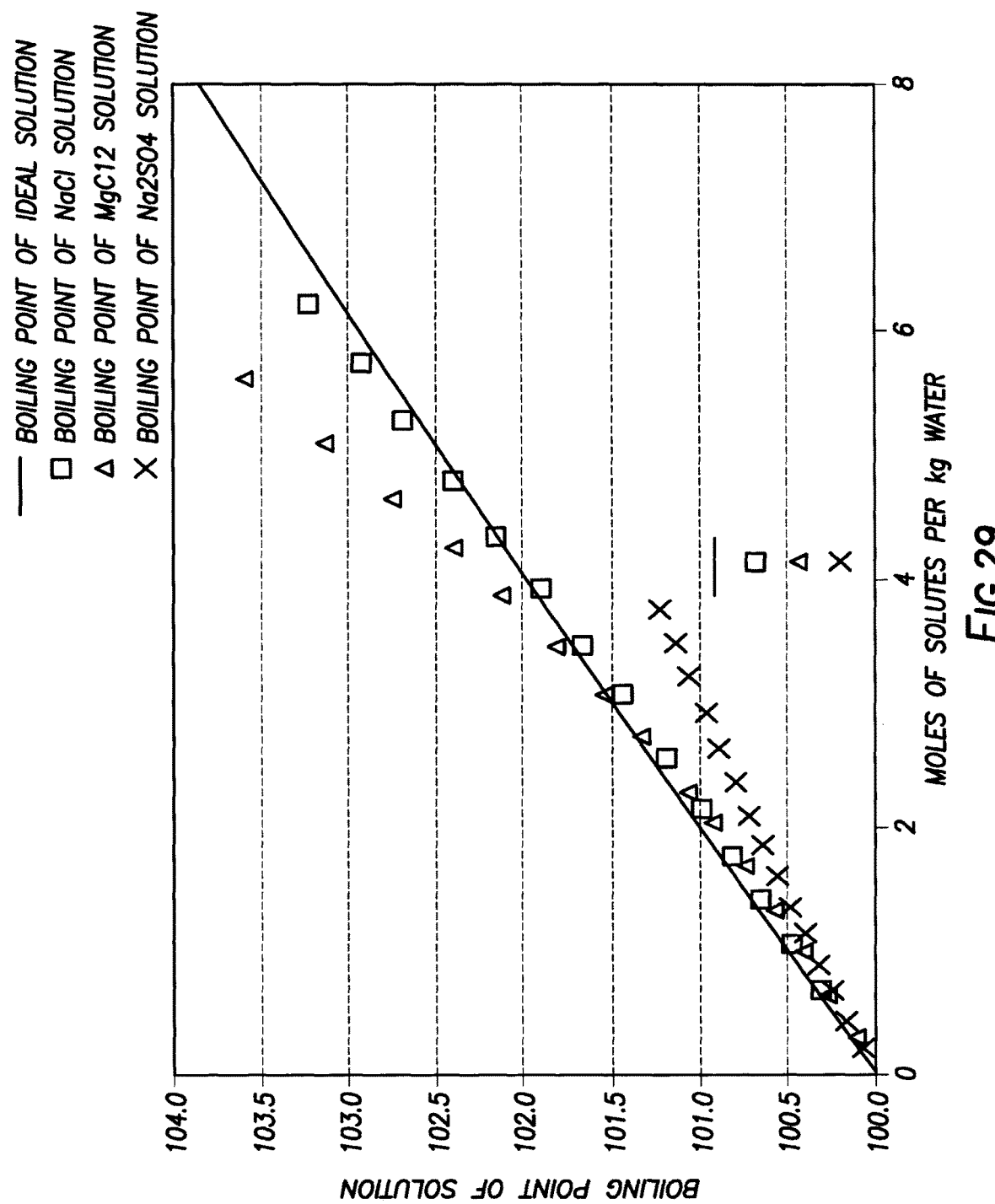
FIG. 29 shows the variation of boiling point of water in relation to salinity.

In the next step, core sample is then dried between about 100° C. and 150° C., between about 105° C. to 125° C., or between about 110° C. to 125° C. for at least 24 hours, between about 36 hours and 48 hours, or approximately 48 hours. The temperature of the drying step of the present methods depends on the boiling point of fluid which can be scaled as shown in FIG. 29. FIG. 29 shows the variation of boiling point of water in relation to salinity and the lower end of the temperature of Step 2 of sequential fluid characterization workflow where core sample is heated to drive out water. The temperature can be as low as 100° C. Additionally, boiling points of fluids vary in solutions of NaCl to $MgCl_2$ and other compounds In addition, oil plays contain a higher hydrocarbons ($C^{5+}$ and above). Gas plays contain lower hydrocarbons ($C4^+$ and below). As shown in FIG. 9, the boiling point of fluids contained in formation is based on salinity and the number of carbon atoms of the compounds. For example, $C^8$ hydrocarbons cannot be removed by heating. FIG. 9 further depicts the upper end of the temperature used the drying step of sequential fluid characterization described herein, where we heat the sample to drive off water. Higher temperatures can be used to drive off the water, but not convert the kerogen into hydrocarbon. As noted above, temperature varies for gas samples from 100° C. to 125° C. and for oil samples from 100° C. to 150 ° C.

As described in Example I below, in order to determine whether a region of formation is occupied by water, sample should be dried to remove water and light oil. For example, as shown on the NMR spectra of FIG. 22, a larger area in the early T2 time did not leave. Therefore, it was concluded that the component was heavy hydrocarbon having a high boiling point.

A first set of NMR data is then acquired from the dried core sample with a high resolution NMR spectrometer. As used herein, data is generally referred to herein as NMR spectra, NMR data, or an NMR data set, each term are used herein interchangeably. For example, two-dimensional NMR spectra are rectangular arrays of real numbers and are commonly regarded as digitized images to be analyzed visually. See e.g., Havel, Timothy F., et al., *Matrix Decompositions of Two-Dimensional Nuclear Magnetic Resonance Spectra*, Proc. Natl. Acad. Sci. USA Vol. 91, 7962-7966 (1994). However, one can treat the NMR spectra as mathematical matrices where linear algebra techniques are used to extract valuable information from them.

To obtain NMR data, useful NMR spectrometers can include benchtop NMR spectrometers currently available from a variety of sources including Magritek, Thermofisher and AZO Materials. Because magnetic field strength determines resolution, NMR spectrometers can have a very strong, liquid helium-cooled superconducting magnet and be large and expensive. Useful core NMR machines include benchtop NMR machines that operate at frequencies from 2-24 MHz. These types of machines include NMR machines from Oxford Instruments, Magritek, and other manufacturers. Recently Oxford Instruments has released a multi-frequency core NMR machine referred to as IMACore, that is also useful in connection with present systems and methods. In addition most table top core NMR machines are calibrated only to measure hydrogen in the core NMR machine. Those table tops can be re-calibrated to measure other elements besides hydrogen. The higher resolution machines like IMACore, can also measure other elements.

Figure 10:
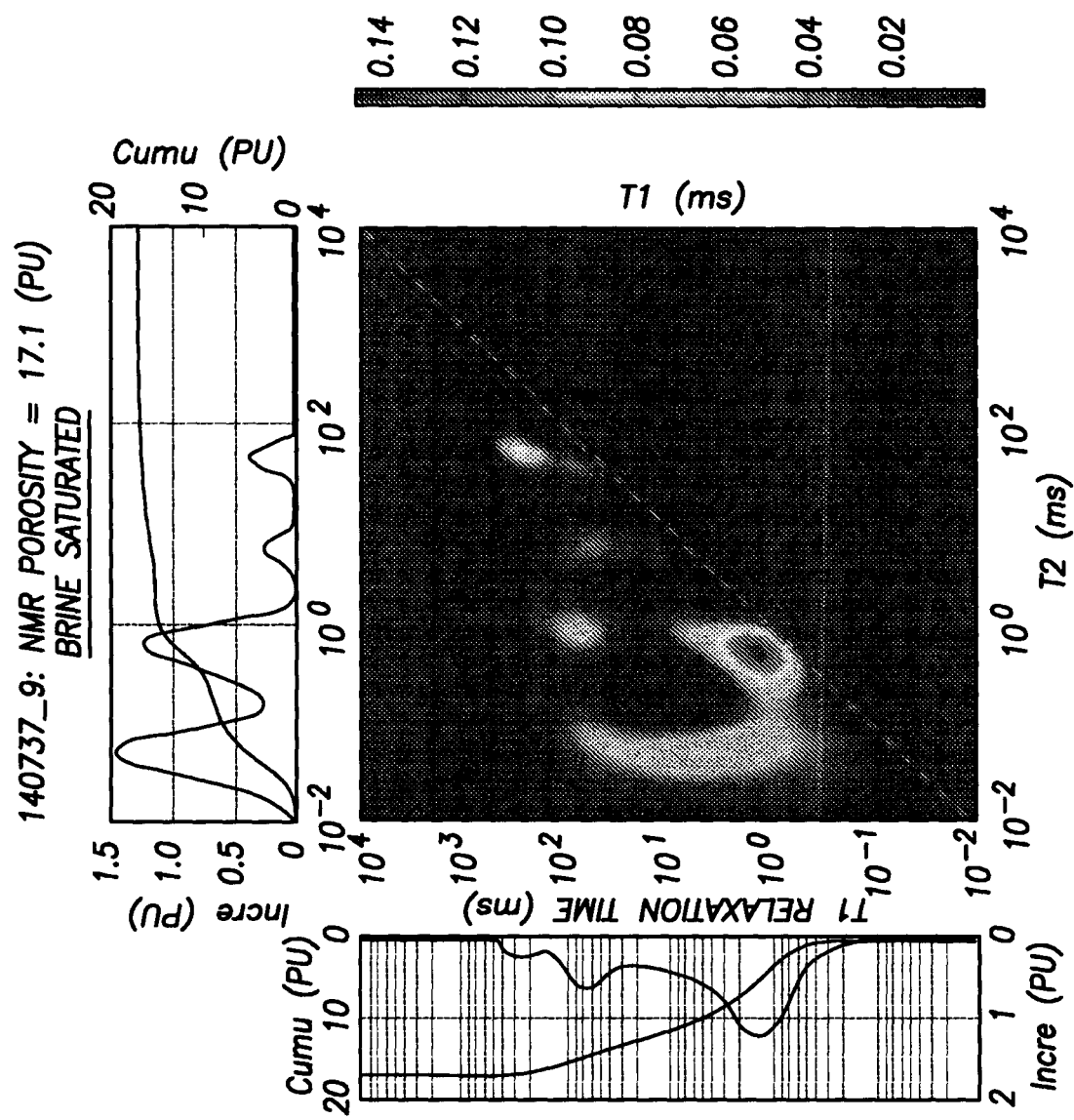
FIG. 10 shows results of sample having areas "cooked off" by the drying process and then saturated with brine. Brine did not enter the area of low T2 times providing assurance that area contained heavy hydrocarbon.

The core sample is then imbibed in brine for up to week, but no less than one day to produce a saturated core sample and at minimal pressure, i.e., 200 psi to formation pressure. Alternatives to brine include, but are not limited to, saturation of core sample in Decan $C^{10}$, helium, neon, argon, methane or fresh water. As shown in FIG. 10, core sample was saturated with brine in areas "cooked off" by the drying process plus some more. Brine does not enter areas of low T2 times which then indicates that area contains heavy hydrocarbon. The area of brine imbibition plus residual hydrocarbon equates to movable porosity. The final weight and volume of the plug are then captured. NMR data is then acquired from the saturated core sample.

Figure 7:
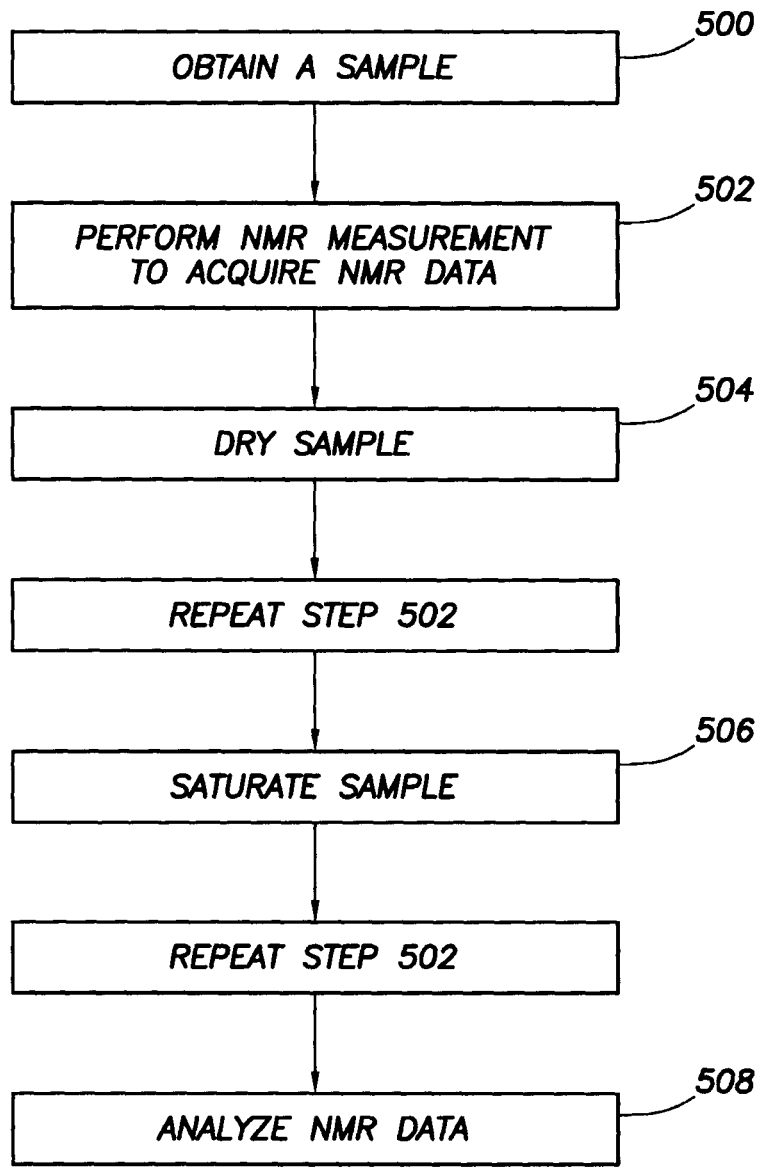
FIG. 7 is a flow chart of general methods steps for core analysis provided herein.

FIG. 7 provides a general flow chart depicting the steps of the present methodology. In step 500, the sample is retrieved from a reservoir or formation. A formation or geological formation is the fundamental unit of lithostratigraphy and comprises a certain number of rock strata that have a comparable lithology, facies or other similar properties. Understanding the geology of a reservoir is essential to its development, production and management and includes understanding the external geology, that is, what created the hydrocarbon trap, and internal geology of the reservoir or the nature of the rocks in which the hydrocarbons exist.

The sample that is retrieved is in its native state and can be retrieved from a shale formation using a wireline tool string or is a cuttings sample. In some embodiments, the sample may be in the shape of a regular cylinder while in other embodiments, the sample may be an irregular shaped sample.

At step 502, NMR spectroscopy of the sample is performed to acquire a first NMR data set. Step 502 begins by placing the sample in proximity to a magnet to apply a magnetic field. This may include, but is not limited to, placing the sample inside the magnet, next to the magnet or having the magnet placed in the sample in the case of an inside out probe.

The sample may be placed in proximity to the magnet for a period of time sufficient to allow the magnetic moment to come to equilibrium aligned along the applied magnetic field. This period of time can about 3 times the maximum $T_1$ of the sample. In other cases, the period of time may be equal to about 10 times the maximum $T_1$ of the sample. In many samples, a period of time of about 10 seconds to 20 seconds may be sufficient.

The NMR system may also be tuned and matched to ensure the best excitation, as the excitation frequency and reflected power of the probe may shift. This is performed by running and adjusting tuning capacitors until the produced signal by the probe is optimized. Tuning is complete when the frequency produced by the probe is within an acceptable frequency distance from the main resonance frequency. Matching is complete when the reflected power is adjusted to an acceptable minimum level. Pulses at about 90° and 180° are then optimized for the particular system of magnet, probe, and sample. The combination of pulse length and pulse power that produces the maximum signal is established as the 90° pulse. The combination of pulse length and power that produces a minimum signal is established as the 180° pulse. Typically when making a measurement, either the power is kept fixed and the length of the pulse is varied to get the different pulses, or the length of the pulse is kept constant and the power is varied. In certain embodiments, a 180° pulse that is twice the power of a 90° pulse is employed, as this keeps the bandwidth used to excite the sample constant and is less likely to introduce issues given the broad line width which often occurs in samples. If other pulse values are needed, 45°, 30°, etc. the necessary pulse length or power is calculated from the empirically obtained 90° and 180° pulses.

As noted above, the NMR measurement is performed using a high resolution NMR system. The NMR system applies a magnetic field to the sample. The NMR system then applies a series of RF pulses according to a pulse sequence. The magnetic field that is applied to the sample is at least about 0.2 Tesla, which generates associated Larmor frequencies of at least 8 MHz. In other embodiments, the frequency is at least about 10 MHz or at least about 20 MHz. The pulse sequences generate NMR signals within the sample and the NMR system detects the NMR signals between or after the RF pulses. The high resolution NMR system detects NMR signals with echo times of less than about 200 microseconds. In further embodiments, the high resolution NMR system detects NMR signals with echo times of less than or equal to about 150 microseconds or less than or equal to about 100 microseconds. Also, the NMR system may have a dead time of less than or equal to 50 microseconds. The "dead time" is the time interval defined by (i) the end of a RF pulse and (ii) the time when the NMR system detects NMR signals. By detecting short echo times and using short dead times, the NMR system is able detect a broader range of NMR signals from the hydrogen-containing components present in the sample.

A series of RF pulses with intermittent delays according to a pulse sequence, such as CPMG or inversion recovery sequence, are applied to the sample in order to measure the $T_2$ and/or $T_1$ relaxation times from the time-domain decay or recovery of the signal. The delay from pulse to data acquisition may range from about 1 to about 50 milliseconds after the start of pulse scheme that acquires the relaxation decay or recovery curve; or from about 16 to about 20 milliseconds after the start of the pulse scheme; or from about 19 milliseconds after the start of the pulse scheme. In some embodiments, the signal is used in a raw form, without the use of chemical shifts and without converting data into the frequency domain by Fourier transform or other means. Measuring and acquisition can be performed by, at least, partially suppressing the water or hydrocarbon signal prior to the beginning of the pulse sequence used to record the relaxation times.

After the first NMR data is obtained, the sample is removed from the NMR system and dried in step 504. The sample can be dried using any conventional method, such as placing the sample in an oven. The sample may be dried at any temperature, such as at a temperature of at least about 100° C., for example between about 110° C.-115° C. The sample may be dried for a period of time at least about 4 hours, or at least about 8 hours, or at least about 16 hours, or at least about 24 hours or even at least about 48 hours.

The dried sample is then placed within the NMR spectrometer (not shown) and an NMR measurement of the dried sample is performed as described above in step 502 to acquire a second NMR data set. After the second NMR data set has been obtained, the dried sample is removed from the NMR spectrometer and saturated with a fluid, such as brine, in step 506. The brine can have a salinity similar to the salinity of the reservoir from which the sample was obtained.

Once the dried sample has been saturated with brine, it can be placed within the NMR system and a third NMR data set is obtained such as described above in step 502. The three NMR data sets are then analyzed to determine at least one formation property, such as by analyzing the exponentially decaying NMR signal in the time-domain using single- or multi-exponential analysis, and comparing differences in the relaxation times $T_1$ and/or $T_2$ for the hydrogen-containing components in the samples.

Having the first, second and third NMR data sets, $T_1$ and $T_2$ relaxation time spectrums, which include amplitude versus $T_1$ and $T_2$ relaxation times, are determined from the first, second and third NMR data sets. $T_1$-$T_2$ plots for each NMR data set can be generated and analyzed to determine total porosity, and the porosity's for each of moveable water, capillary bound water, clay bound water, heavy hydrocarbons and light hydrocarbons.

In the present systems and methods, NMR data is used to determine the following formation properties: (1) total porosity; (2) porosity for each of: (a) moveable fluid, (b) capillary bound fluid, (c) clay bound fluid and (d) heavy hydrocarbons; (3) total organic hydrogen content; and (4) water saturation.

Figure 30:
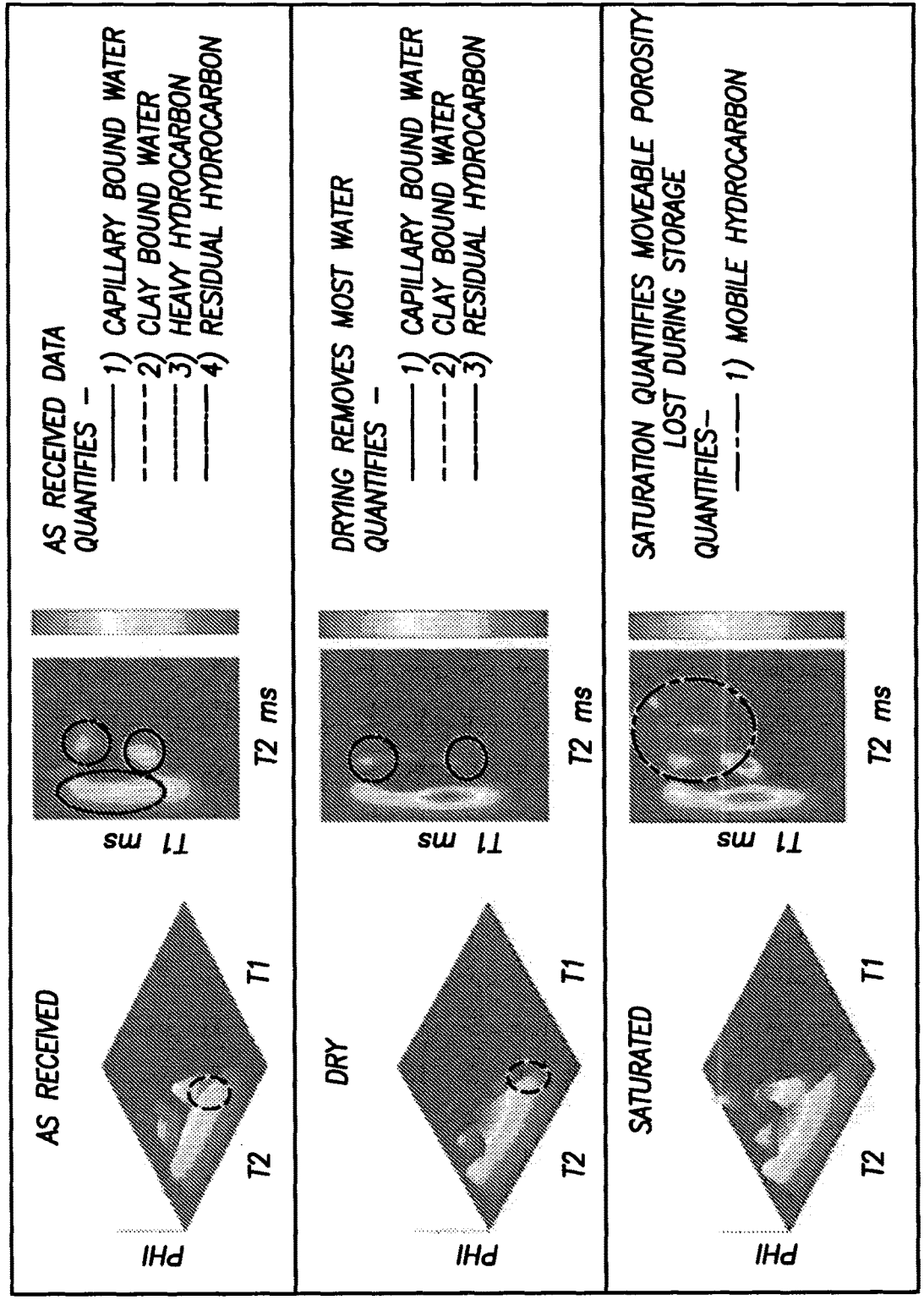
FIG. 30 shows various three dimensional plots as used in the step of analyzing the NMR data.

FIGS. 30A, 30B and 30C include a cross plot as a T1/T2 plot with porosity shaded with the color bar, and a XYZ plot with X axis of T2, Y axis of T1, and Z axis of porosity measured with NMR. The NMR data also presented in a three dimensional ("3D") matrix. FIGS. 30A, 30B and 30C show the three sets of NMR data as used in sequential fluid characterization. FIG. 30A shows a first set of NMR data or "As received" data that can quantify the following formation properties: (i) capillary bound water; (ii) clay bound water; (iii) heavy hydrocarbons; and (iv) residual hydrocarbon. FIG. 30B shows a second set of NMR data or "dry" data (where the step of drying removed most water) that can be used to quantify (i) capillary bound water; (ii) clay bound water; and (iii) residual hydrocarbons. FIG. 30C shows a third set of NMR data or "saturated data" (where saturation quantifies movable porosity lost during storage) that quantifies mobile hydrocarbon.

More specifically, FIGS. 12A1, 12A2, 12A3, 12B1, 12B2, 12B3, 12C1, 12C2, and 12C3 collectively depict how NMR data is inputted into a SFC workflow. NMR raw data matrices: an "as received" matrix; a "dry" matrix; and a "saturated" matrix are processed using mathematical matrices as follows: 1) As Received matrix minus Dry matrix; 2) Saturated matrix minus Dry matrix; and 3) Saturated matrix minus As Received matrix. Processing of the matrices in the SFC workflow in such a manner separates NMR raw data and provides the components and the properties of the formation and/or the reservoir which include, but are not limited to, capillary bound fluid, clay bound fluid, residual hydrocarbon, heavy hydrocarbon, and moveable fluid porosity. Ozen, A. E. et al., *T1/T2 NMR Surface Relaxation Ratio for Hydrocarbons and Brines in Contact with Mature Organic-Shale Reservoir Rocks*, Petrophysics Vol. 54, 11-19 (2013); Jiang, T., et al., *Integrated Petrophysical Interpretation of the Eagle Ford Shale with 1-D and 2-D Nuclear Magnetic Resonance (NMR)*, 54$^{th}$ SPWLA Annual Logging Symposium, Jun. 22 ,2013; Mansoor, R. A., et al., *Characterizing Light versus Bound Hydrocarbon in Shale Reservoir by integrating New Two-Dimensional NMR and Advanced Spectroscopy Measurements*, URTEC 2016 San Antonio.

The sequential fluid characterization system provided herein includes a high resolution NMR spectrometer and an analysis system that includes a processor and non-transitory, computer-readable medium. The processor, the non-transitory, computer-readable medium or combinations thereof may comprise code. The sequential fluid characterization system can also include a graphical processing unit (GPU) and a graphical user interface (GUI). The code is configured to calculate and distinguish SFC components in a sample. This is accomplished by using matrix math of 3D plots including T1,T2 and porosity.

Figure 8:
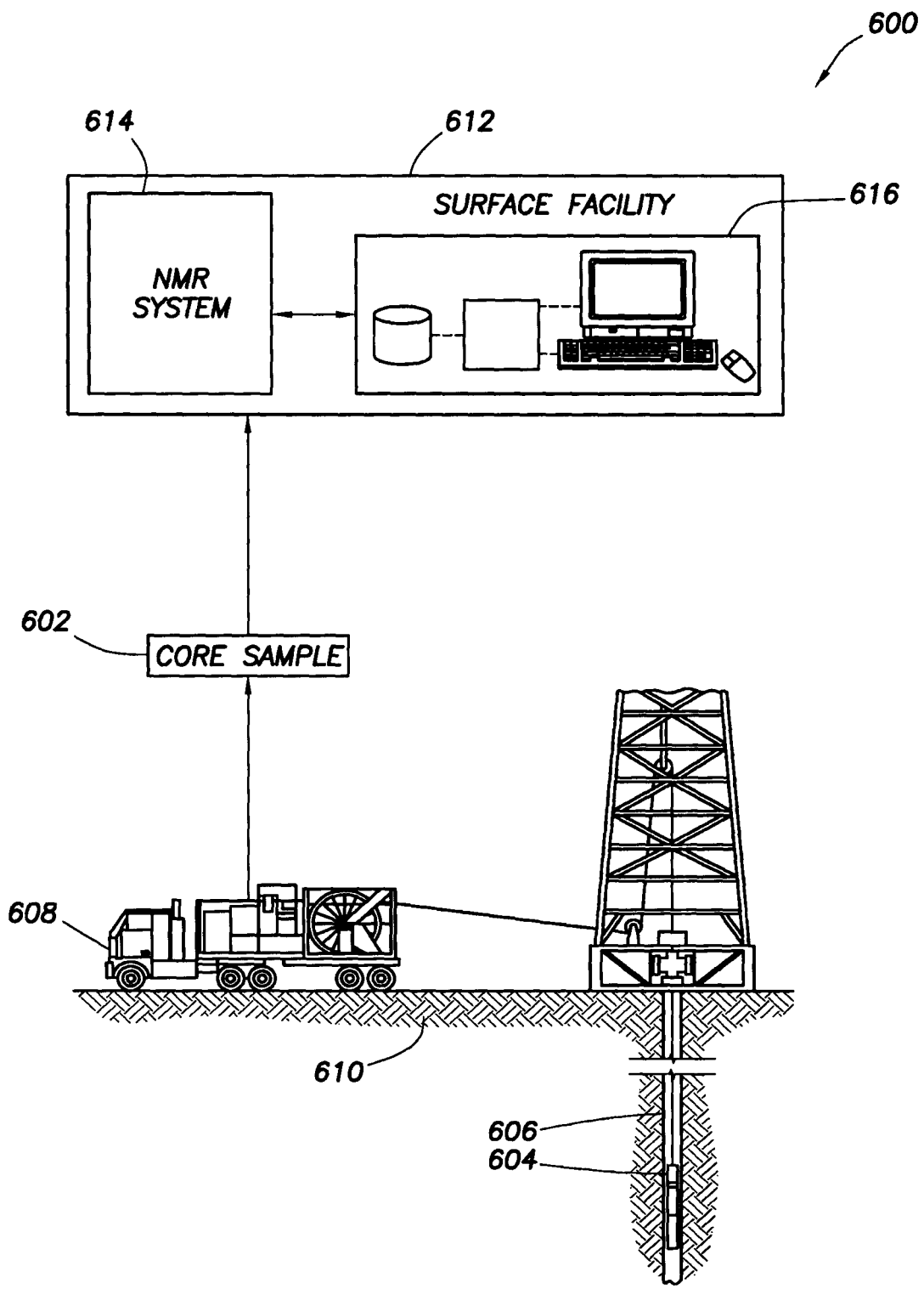
FIG. 8 shows an exemplary NMR system.

As shown in FIG. 8, a sequential fluid characterization system can further comprise a wireline tool string 604 that is deployed in a well 606 via a wireline truck 608. The wireline tool 604 is a downhole tool and is configured to remove a sample 602 from a formation 610 using, for example, a coring device. In another embodiment, the sample is a cuttings sample. Cuttings samples are pieces of formation that are cut away from the formation by a drill bit during a drilling operation and are retrieved from drilling mud that circulates to the surface. This disclosure is not limited to analysis of any particular type or form of sample or retrieval system used to obtain samples.

Once the sample 602 is obtained, it is transported to a surface facility 612 equipped to carry out additional processing of the sample (for e.g., drying the sample and saturating the sample) and analyze NMR data. The surface facility 612 is located at the well 606, such as in a truck or a cabin. In other instances, the surface facility 612 is located in a location remote from the well 606, such as in a laboratory. The analysis system 616 includes a processor and non-transitory, computer-readable medium. The processor, and the non-transitory, computer-readable medium, and/or combinations thereof may comprise computer code. The analysis system may also include a graphical processing unit (GPU) and a graphical user interface (GUI), such as a monitor, a touch screen, a mouse, a keyboard and/or a joystick. The GUI allows an operator to control and communicate with the NMR spectrometer 614. For example, the NMR spectrometer can detect NMR signals with echo times of less than 200 microseconds, for example less than or equal to 100 ms. The NMR spectrometer 614 is used to perform a NMR measurement on the sample and to obtain NMR data sets. The NMR data sets are communicated to the analysis system. The SFC system utilizes NMR data to generate a parameter, for example a $T_1$ and a $T_2$ relaxation time spectrum and to determine different formation properties.

The sample can be taken from a shale formation and analyzed with the subject methods. Shale formations are composed of fine-grained sedimentary rock. Some shale formations are rich in organic material and may be source rock for hydrocarbon reservoirs. In some cases, the shale formations also contain oil and gas.

EXAMPLE I

Figure 11:
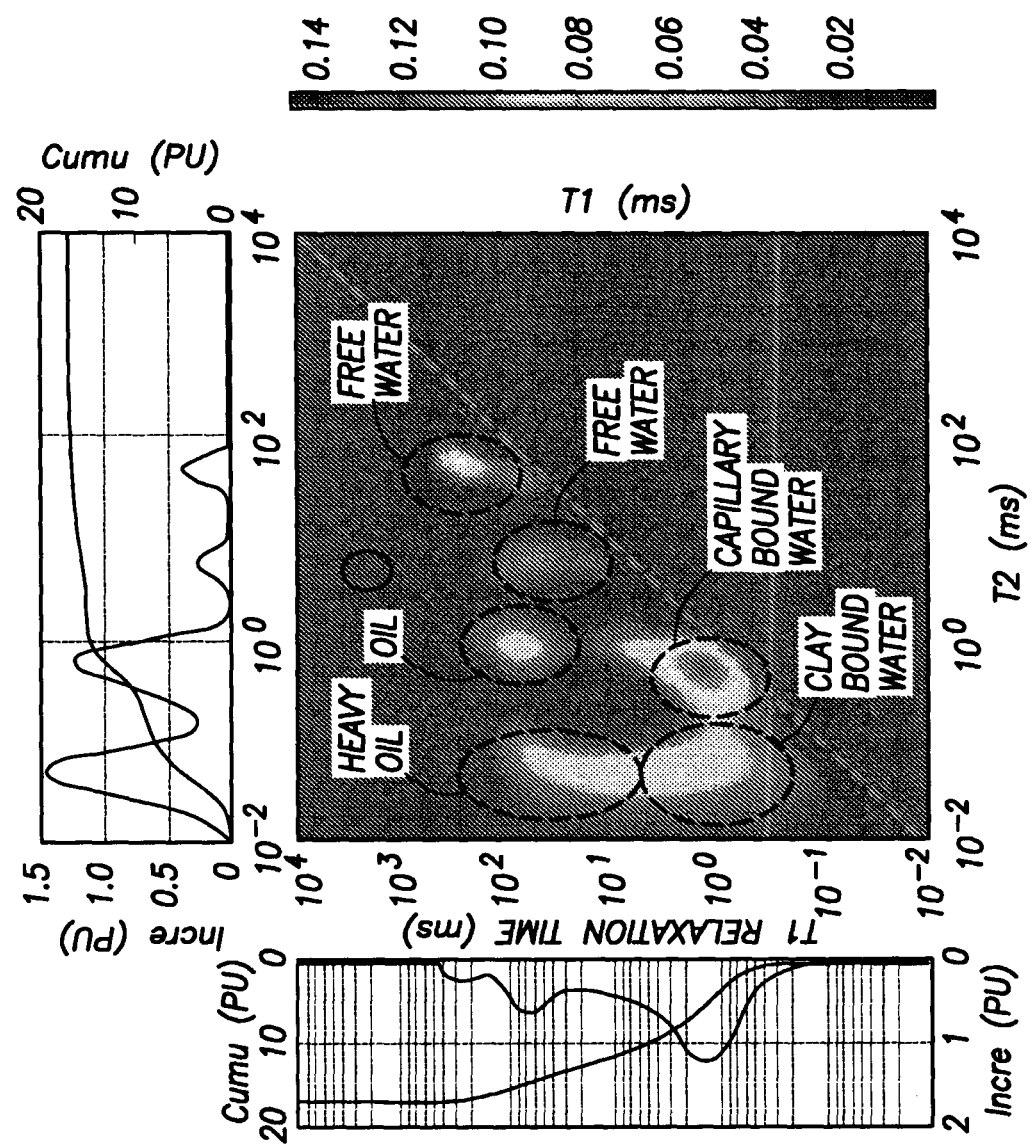
FIG. 11 shows high resolution NMR results where various properties can be determined.
Figure 14C:
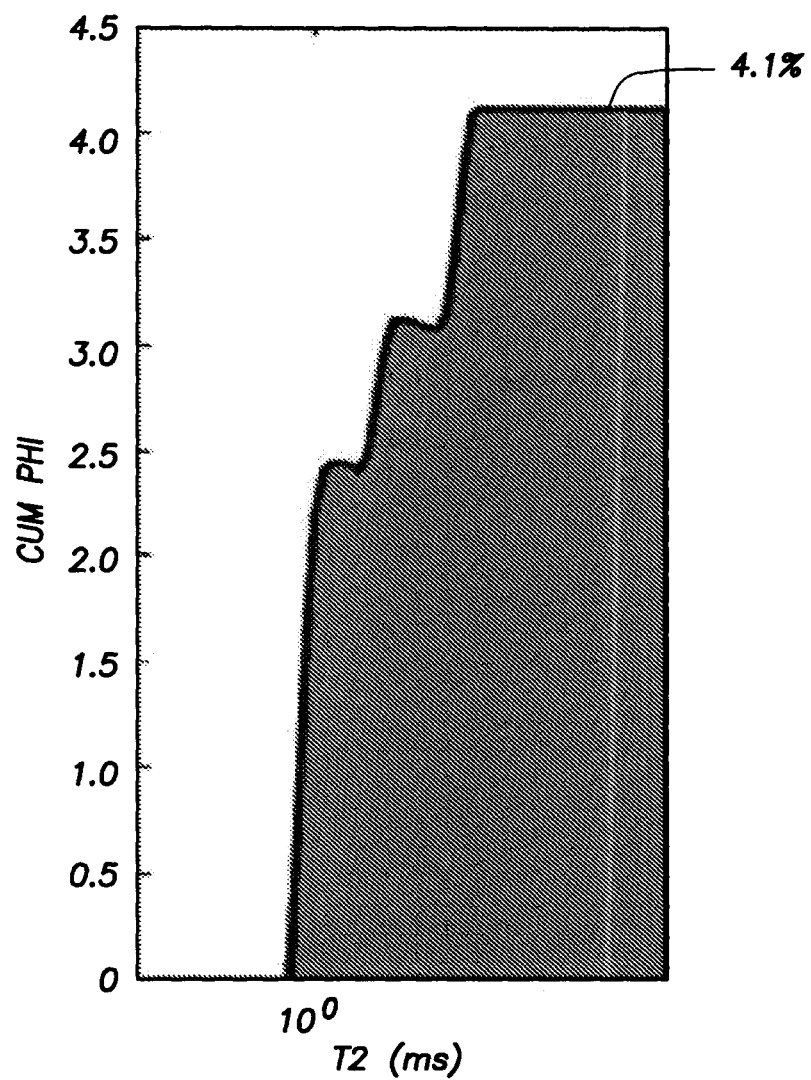
Figure 16:
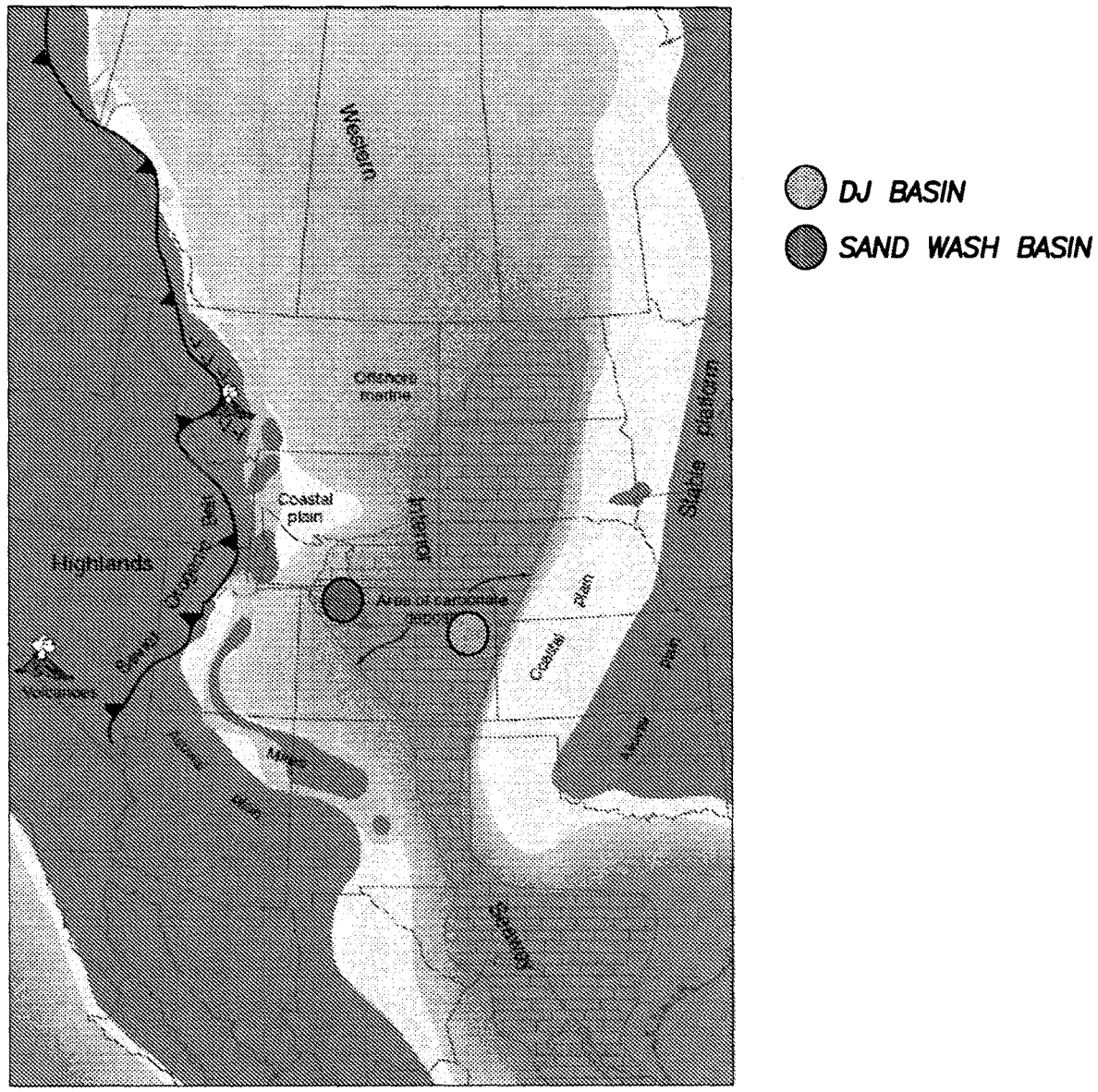
FIG. 16 is paleogeographic interpretation of the Western Interior Seaway during the Cretaceous.
Figure 17:
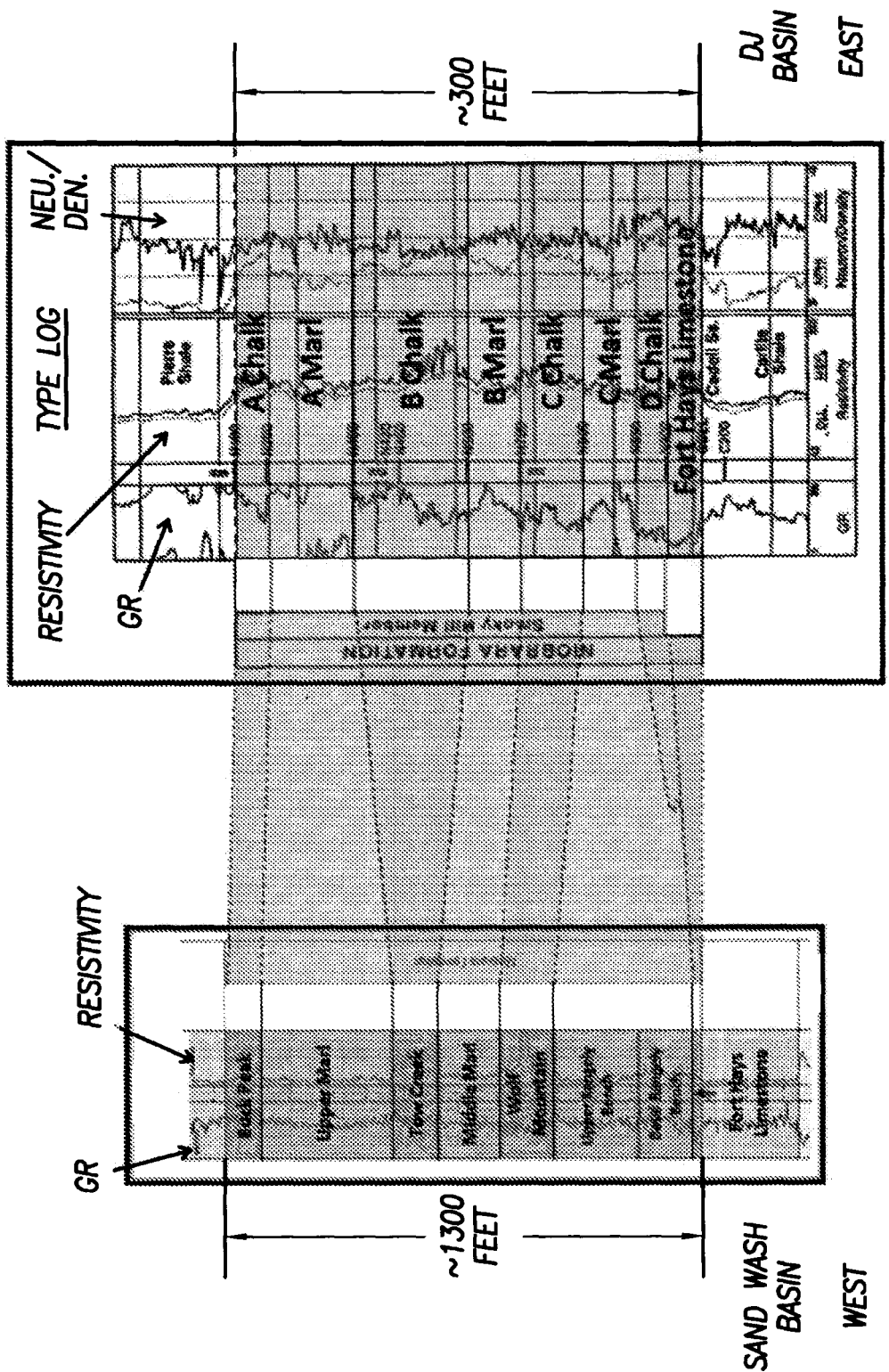
FIG. 17 is a schematic illustration showing the time stratigraphic correlations between the productive Niobrara benches in the DJ basin to the Sand Wash basin in western Colorado.
Figure 19:
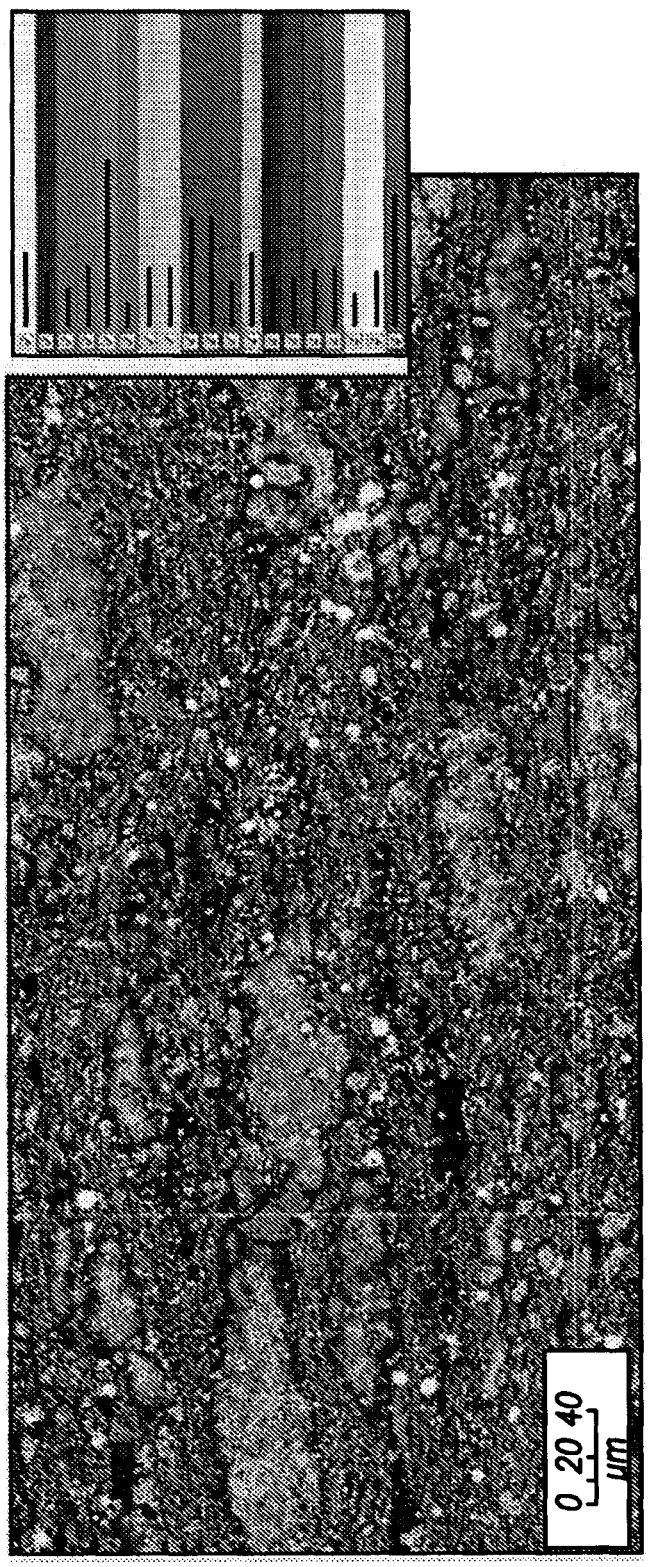
FIG. 19 is a combined SEM and EDS image of the same thin section of FIG. 17. The combined imaging using Qemscan, illustrated that the pellets that contained the significant micro pores were composed primarily of calcite. The image also illustrated the significant amount of organics by the black coloring.

The Niobrara formation was deposited in the late Cretaceous in the epicontenintal Western Interior Seaway. FIG. 16. This formation can be highly productive in the DJ basin on the eastern side of the Cretaceous seaway and is described as a Chalk and Marl with distinguishing benches composed of coccolith rich fecal pellets and pelagic clays (see Stout, L. "Carbon Isotope Chemostratigraphy of the Niobrara formation, Denver Basin, Colo.", Colorado School of Mines Master's Thesis. (2012)). The Niobrara formation continued deposition with similar benches across the Cretaceous seaway to the western slope in what is now called the Sand Wash basin. FIG. 17. See Finn, T. M., et al., *Niobrara Total Petroleum System in the Southwestern Wyoming Province: USGS Petroleum Systems and Geologic Assessment of Oil and Gas in the Southwestern Wyoming Province, Wyoming, Colorado, and Utah*, Chapter 6 (2005)). The Niobrara in the DJ and Sand Wash basin can be informally divided into seven benches that alternate between chalk and marl. In the Sand Wash basin the three prospective units are the Buck Peak, Tow Creek, and Wolf Mountain marl's. The Tow Creek bench was the focus of the study, as it is primarily composed of beds of organic material and pellets. The pellets were differentiated easily in thin sections as light and dark, as shown in FIGS. 11A, 11B and 11C. Determining the pellets composition, thin sections were analyzed using Qemscan. Qemscan is a combination of SEM imaging with Energy Dispersive X-Ray Spectroscopy ("EDS") as shown in FIG. 19. The results provided a lithological and digenetic interpretation of the sample that was not possible using standard thin section analysis. The Qemscan analysis determined the light pellets were primarily calcite while the dark pellets were organic rich. Further analysis indicated the importance of the light pellets to the reservoir viability of the Tow Creek as seen in the thin section analysis using epiflorescene. The light blue florescence 810 in the light pellets represents micro-porosity, which was pervasive in the Tow Creek bench.

As shown in FIG. 18A, a thin section photomicrograph taken from the Tow Creek bench in the Sand Wash basin. FIG. 18B represents a zoomed image of the same thin section seen on the left to illustrate the two types of pellets, light and dark. As shown in FIG. 18C, the light pellets when viewed with epi-florescence showed significant micro pore development. The light pellets can make up close to 30 to 40% of the field of view in Tow Creek thin sections.

Problem

A Sand Wash well was drilled and completed in the Tow Creek bench of Niobrara with reasonable success in the black oil window (@40API and Ro 0.85). Approximately 600 feet of core was taken with analysis being performed every ten feet which included porosity and saturation determinations using the GRI methodology. Interestingly, all samples (60 in total) came back with porosity in dynamic range of 4.5-6.5%. The samples taken from the landing zone yielded total water saturation ("SWT") of approximately 65%. This high SWT measurement from GRI yielded a bulk volume hydrocarbon ("BVH") of 1.5-2%. The well did not produce any water during production. Considering that the BVH was only 1.5-2%, it indicated that in order to match production to reservoir quality, either frac height must be anomalously high (greater than 200 ft), or the recovery factor in black oil window is substantially higher than thought (greater than ~40-50%).

Initial Hypothesis

Many issues were considered in attempting to resolve the odd correlation of low BVH and high SWT to production. One possibility considered was that the sample was not properly cleaned for the GRI procedure. This is a common problem when attempting GRI methodology as the proxy for a cleaned sample is when the toluene stops visibly changing color. Even though the sample was crushed to expose increased surface area in a low permeability rock, it's thought that the toluene did not infiltrate the rock entirely with a qualitative view of discoloration. This possibility was further amplified since significant micro-pore development was observed in light pellets (FIG. 18C) which were usually encased or surrounded by organics as seen from the Qemscan analysis (FIG. 19). Considering these observations, if the sample was not cleaned properly, porosity would be significantly under predicted.

An alternative possibility was that since water saturation is a relative term, the 65% water measured from GRI methodology could be bound and the formation would only produce free water. To confirm was difficult since GRI methodology cannot determine free, irreducible, and structural water. Another issue with GRI methodology is the lack of standardization between core analysis vendors. Therefore, to attempt to investigate the initial hypothesis it was determined to pursue conventional core NMR since it can separate fluids and is independent of cleaning.

Initial NMR Analysis

NMR data of sample is capable of identifying the correct porosity as well as the associated water (including structural or free water). A Tow Creek sample was run using an industry standard procedure. Only $T_2$ measurements were acquired using a 0.2 ms inter echo time (TE) and 2 MHz equipment. Measured porosity was 7.5% which was about 1% higher than the porosity that was measured according to GRI methodology. This change was not substantial and still did not resolve the prior mentioned problems of an anomalously high frac height and recovery factor.

Figure 20:
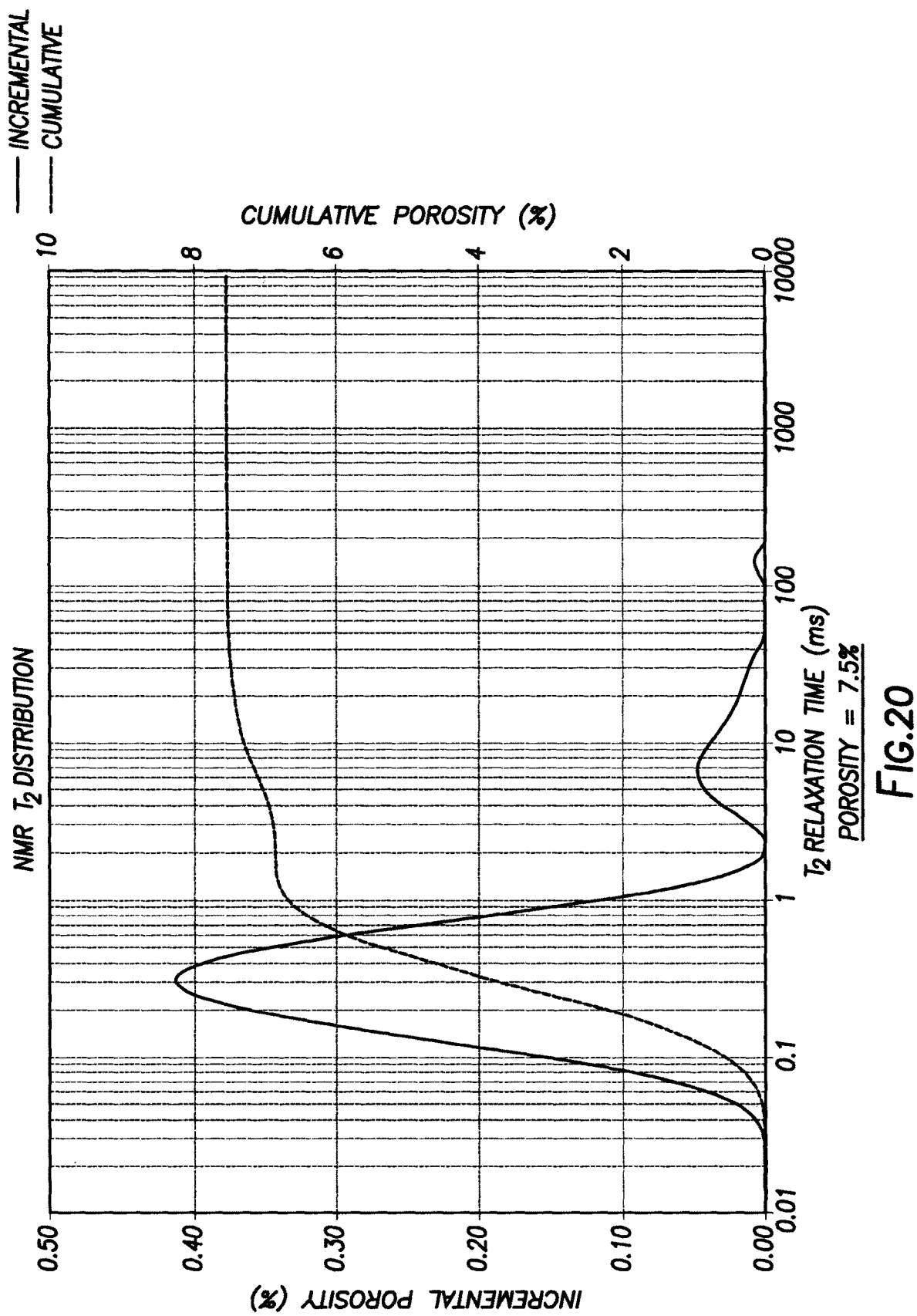
FIG. 20 provides initial results from the conventional NMR with only T2 relaxation times run at 0.2 ms echo and on the 2 MHz machine.
Figure 21:
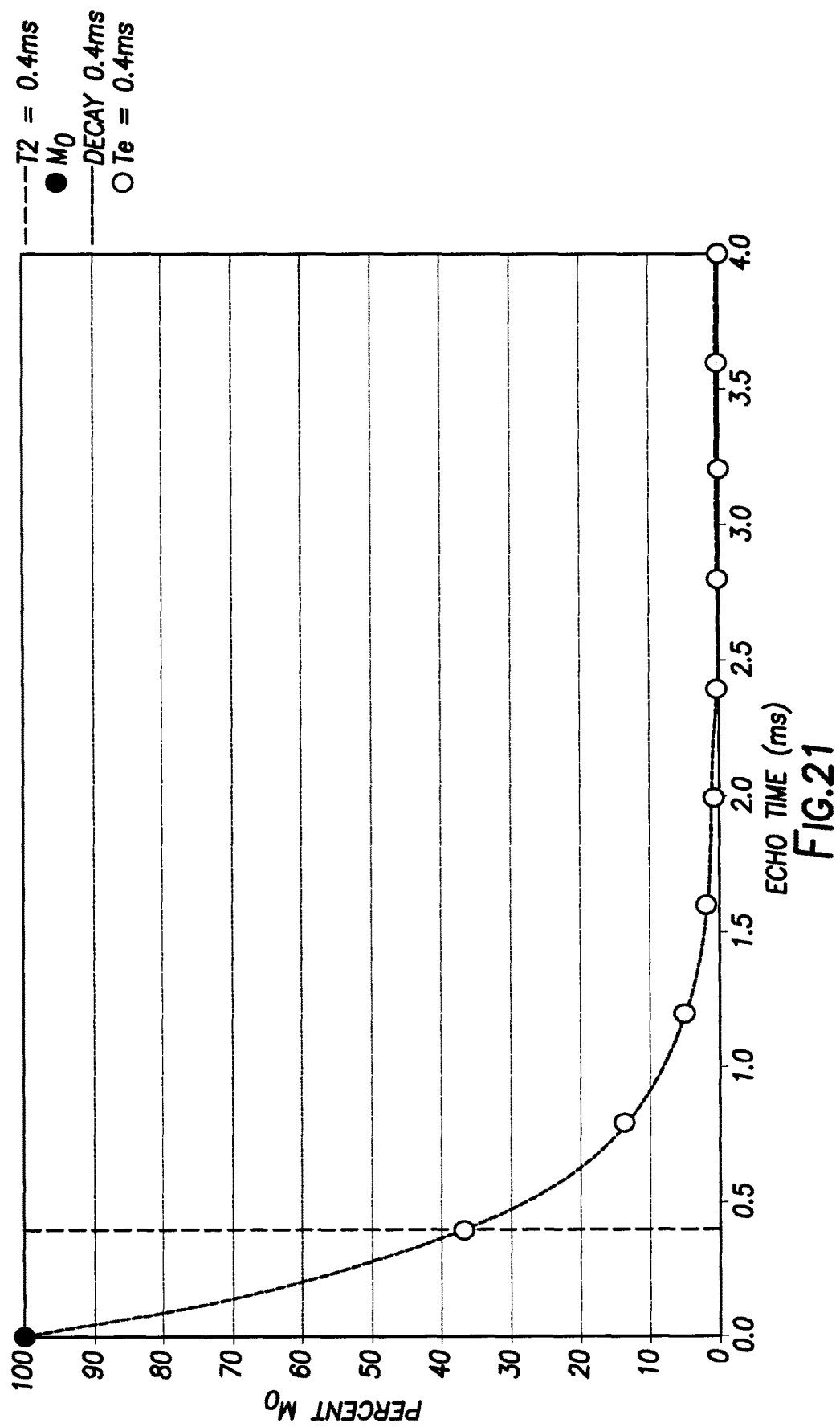
FIG. 21 is a schematic illustrating the percent of the signal captured from a NMR measurement with changing echo time. Note the wireline tool has an echo of 0.4 ms which captures approximately 40% of the signal. Using high resolution NMR with an echo time of 0.1 ms allows one to capture close to 80% of the spectrum. As described herein, it should be noted most nano pores will occur in the early decay times which will only be visible at low TE.

FIG. 20 shows the initial results from the conventional NMR with only T2 relaxation times run at 0.2 ms echo and on the 2 MHz machine. The result yielded a total porosity of 7.5%, which was not a significant increase to what was previously measured from GRI methodology. FIG. 21 is a schematic illustrating the percent of the signal captured from a NMR measurement with changing echo time. Note the wireline tool has an echo of 0.4 ms which captures approximately 40% of the signal. Using high resolution NMR with an echo time of 0.1 ms allows one to capture close to 80% of the spectrum. It should be noted most nano pores will occur in the early decay times which will only be visible at low TE.

Figure 22:
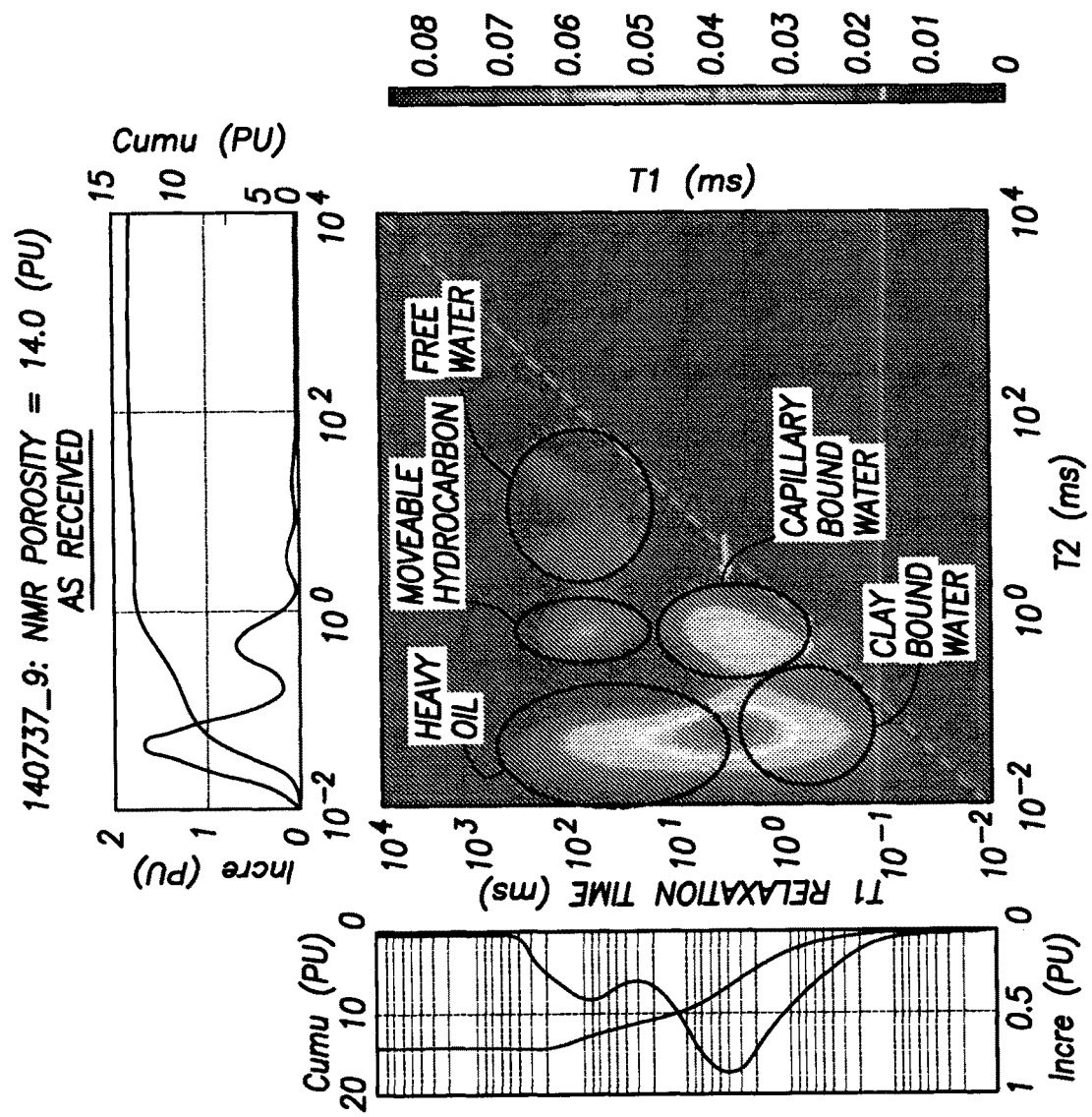
FIG. 22 shows initial results of the high resolution NMR on the Tow Creek sample with identified regions on the T1/T2 map. Initial results yielded 14% porosity and a high content of heavy hydrocarbon.
Figure 23:
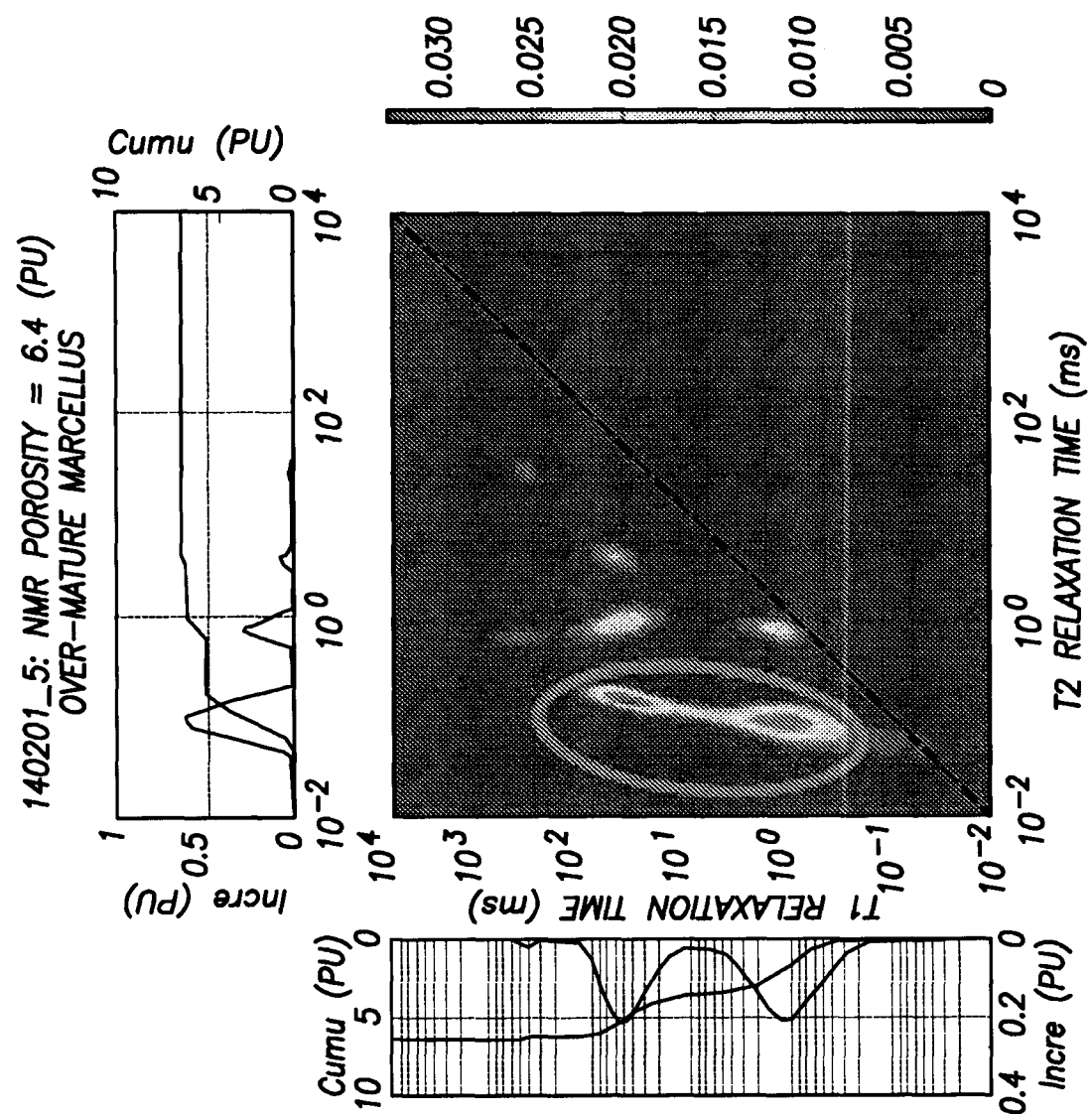
FIG. 23 shows high resolution NMR results for an overmature Marcellus sample. A significant decrease in the heavy hydrocarbon amount was observed. The lack of repeatability gave credence to the theory that early time arrivals are not noise.
Figure 24:
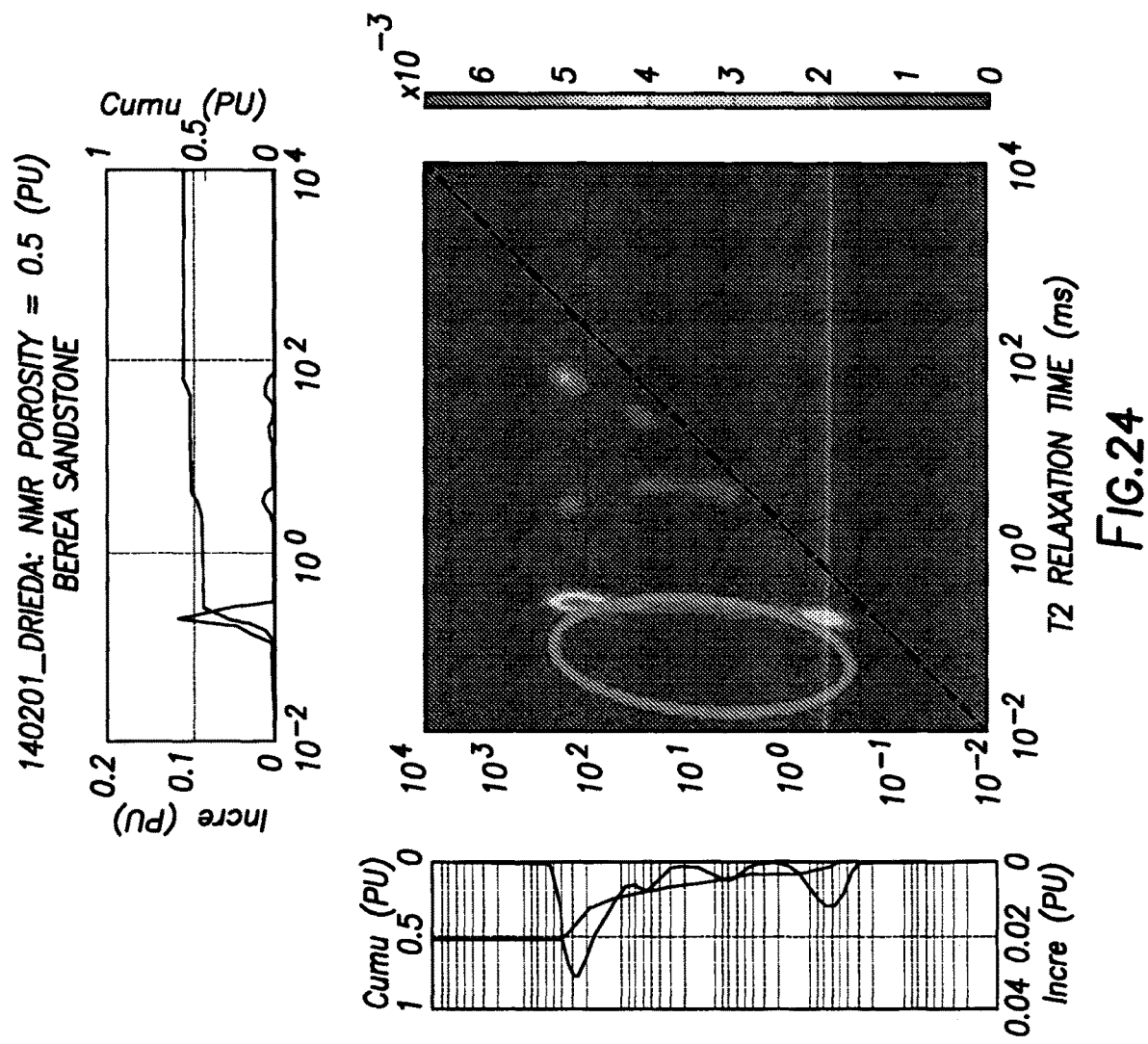
FIG. 24 shows high resolution NMR results for a tight, clay devoid Berea sample. The results came back as 0.5% porosity and no early time arrival signal. This illustrated the early time arrivals are likely a heavy hydrocarbon and not noise. If the early time arrivals were noise, it would have been visible in a low porosity sample.

The difference between NMR logging (logging tools) and NMR sequential fluid characterization as described herein are frequency and resolution of NMR. NMR logging tools operate at 1 to 2 KHz and a max of 2 MHz. In the present systems and methods, NMR operates at a frequency greater than 2 MHz. In addition, resolution (as defined by Te or echo spacing) of logging tools is typically at a minimum between about 0.6 to 0.3 ms. Resolution of NMR as applied in the present methods and systems is less than or equal to 0.2 ms and can be as low as 0.05 ms. Hence, in sequential fluid characterization resolution is improved by 7-8 times over that of logging tools. Furthermore, signal to noise ratio for NMR of the present methods and systems is in excess of 100, which is close to 10 times better. FIG. 22 demonstrates improvements. In SFC, an echo spacing of 0.1 ms or less can help resolve early T1/T2 times (micro and nano porosity) which cannot be resolved by logging tools typically limited to echo spacing of 0.2 ms.

Moreover, conventional rocks have much larger pore sizes and therefore have a slower relaxation time. Because unconventional rocks of unconventional plays (unconventional geological formations) have nano pores, NMR relaxation times can be very fast and most of the signal may not be recorded using 0.2 ms echo spacing on the 2 MHz machine. On the other hand, in conventional plays (conventional geological formations) where the first NMR measurement is made in the T2 domain (i.e. 0.4 ms after 90 degree pulse), up to 60% of the signal has already been decayed and not measured in $T_2$ decay (FIG. 21). On the other hand, in unconventional rocks, porosity primarily exists in this early signal that is not recorded using conventional NMR techniques.

Based upon these observations in a next experiment, we attempted using the NMR dropped the Te to 0.1 ms (capturing almost 90% of the decay) as well as using a 20 MHz machine to boost the signal to noise ratio. The results from the high resolution NMR were drastically different with a measured porosity of 14%. As shown in FIG. 22, with known fluid responses to NMR, T1/T2 map can be used to identify fluids on the high resolution map. The increase in porosity to 14% resolves the prior mentioned issues with production in the Sand Wash well.

Based upon these observations, yet another subsequent NMR measurement was made at a lower inter echo time of 0.1 ms (which captured almost 90% of the $T_2$ decay) as well as using a 20 MHz machine to boost the signal to noise ratio. From this high resolution NMR measurement, the porosity was determined to be 14%, surprisingly different from the porosity's determined above. Using the known fluid responses to NMR, a $T_1/T_2$ map was produced to identify fluids on the high resolution map. (FIG. 22) The increase in porosity to 14% resolved the prior mentioned issues with production in the Sand Wash well.

Potential Errors and Mitigation

Figure 25:
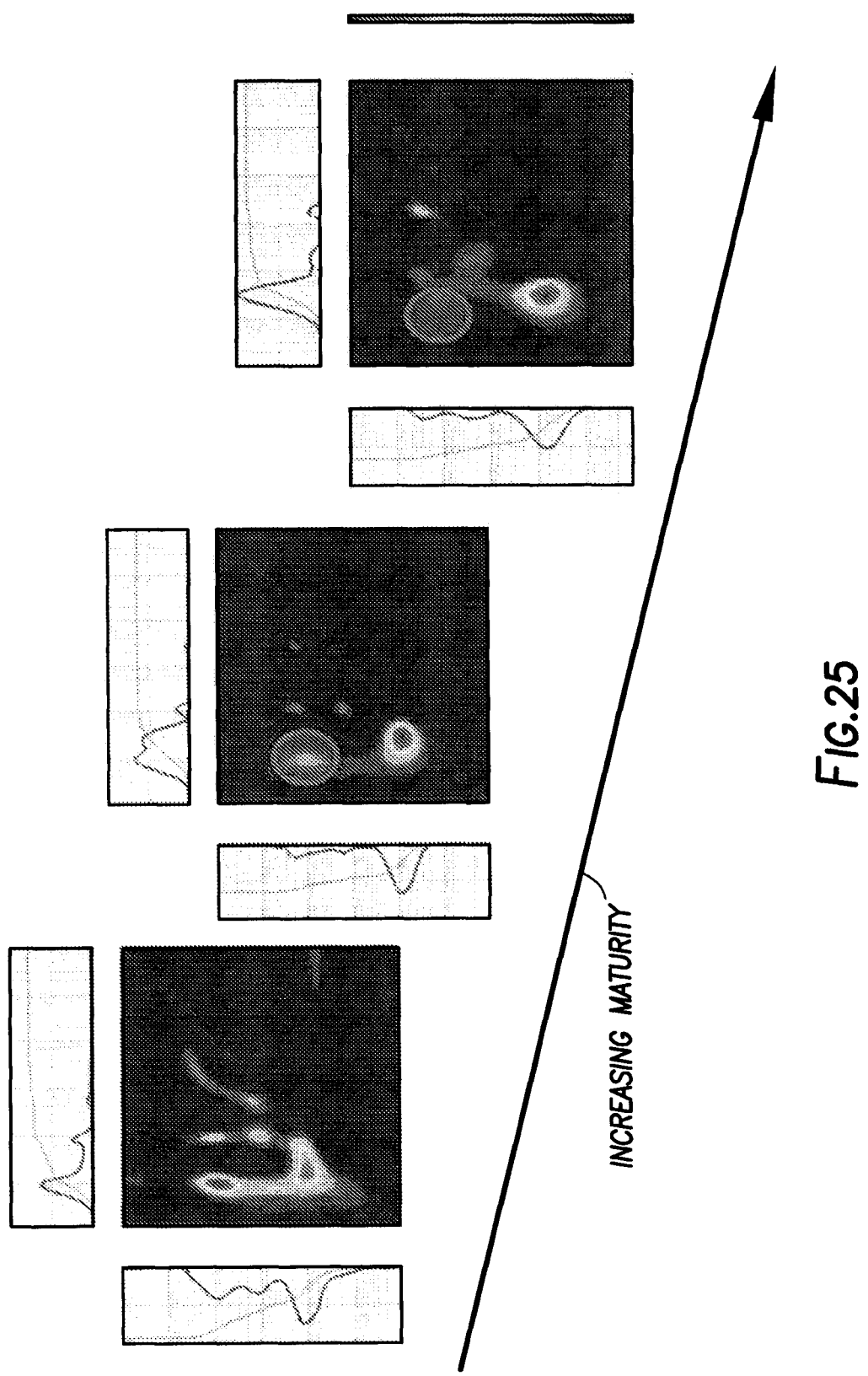
FIG. 25 shows high resolution NMR results of artificially maturing a Marcellus sample. The results showed a disappearance of porosity signal from the region circled in red as the sample was matured. This indicated what exist in the early times is being cracked during maturation.
Figure 26:
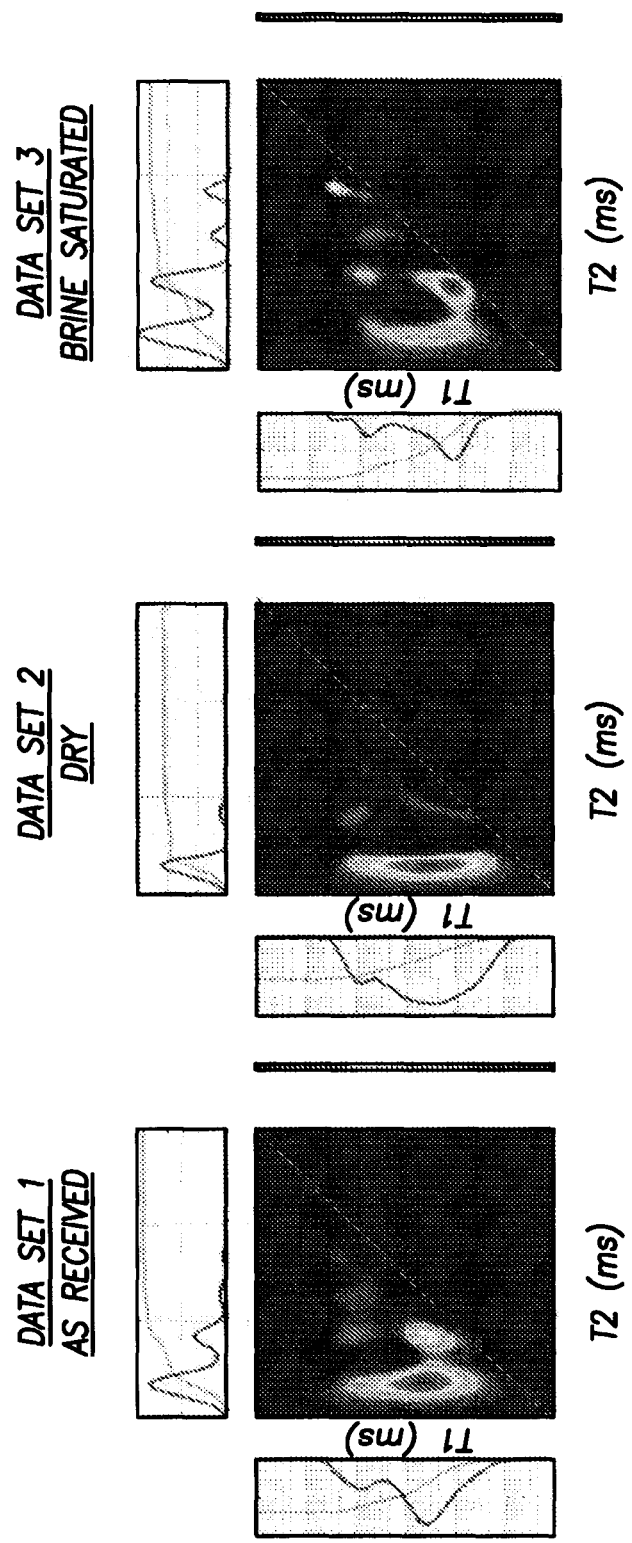
FIG. 26 shows three high resolution NMR results used in the SFC methodology taken from the Tow Creek sample. NMR Data Set 1 or as received, yielded a porosity of 14%. NMR Data Set 2 or dried sample, measured a porosity of 10.7%. NMR Data Set 3 or Brine Saturated, was determined to have a minimum porosity of 17.1%.

The high porosity results from the high resolution NMR helped resolve the production to core discrepancy, however much doubt was cast over the data in the early time arrivals. Another study identified the early time arrival data as clay bound water and heavy hydrocarbon. Conventional thought suggested the early time arrivals that were identified as clay bound water and heavy hydrocarbon using a 0.1 ms inter echo spacing was either noise or solids being wrongfully identified as porosity. To help resolve this questions it was decided to run a series of experiments:

1. Clean and low porosity Berea sandstone (FIG. 17)
   a. A clean Berea sandstone sample was chosen to verify the potential error of having noise or solids recorded as porosity. The results did not identify any early $T_2$ time porosity that could be interpreted as noise or solids.
2. High maturity Marcellus with high TOC (FIG. 25)
   a. A high maturity Marcellus sample was chosen as it was mostly devoid of heavy hydrocarbon (i.e. it would have been cracked into lighter hydrocarbons). The results were minimal signal in the early $T_2$ times and a significant decrease in the amount of heavy hydrocarbons. The lack of repeatability gave credence to the theory that early time arrivals were not noise.
3. Artificially matured Marcellus sample (FIG. 26)
   An experiment was performed to artificially mature a Marcellus sample to determine if the early $T_2$ times were noise. As shown in FIGS. 12A2 and 12A3, 12B2 and 12B3, and 12C2 and 12C3, the porosity signal in the region circled indicated that what existed in the early $T_2$ times was cracked during maturation. In particular, heavy hydrocarbon lost signal and cracked to lighter hydrocarbon as the sample matured. Thus, the early $T_2$ times were not noise (the same signal would appear at different maturities since noise is repeatable).

Sequential Fluid Characterization

Figure 27:
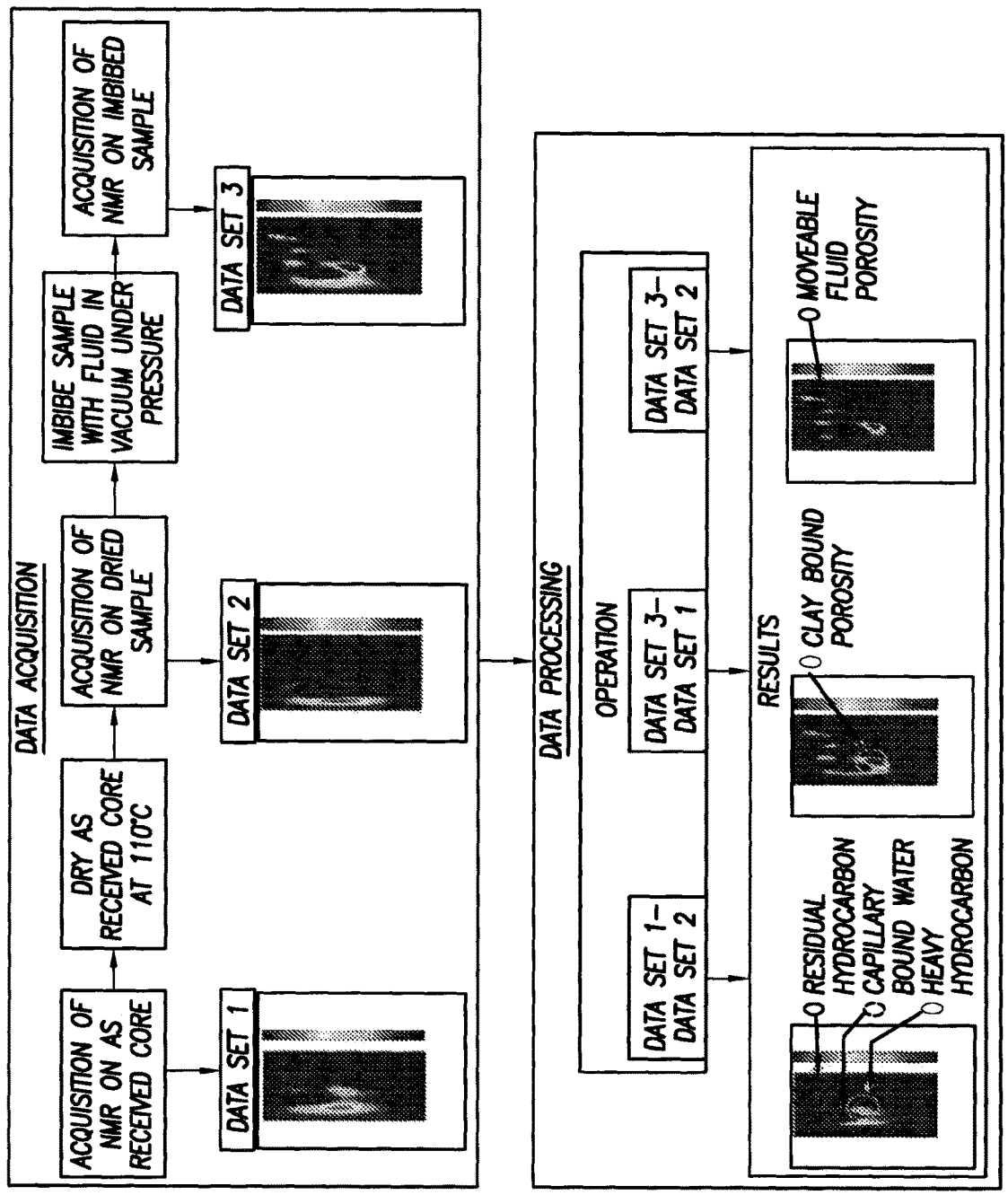
FIG. 27 is a flow chart representing the acquisition of the three data NMR sets used in the SFC methodology and then the data processing of the NMR data set in order to determine formation properties including fluid components and porosity of the reservoir.

While an increase in overall porosity was identified using high resolution core NMR, it was still desirable to differentiate the particular fluids. Using the SFC described herein, porosity can be separated into clay bound water, capillary bound water, movable hydrocarbon, movable water, and heavy hydrocarbon. The process encompasses three NMR measurements, which in this paper will be referred to as data sets. Data set one is acquired on as received sample. Data set two is acquired after the drying of the as received core. The sample is dried for 48 hours while collecting residual fluids at 110 degrees Celsius. It is dried at 110 degrees Celsius as water's boiling point is 100 degrees Celsius so most water will move and heavy hydrocarbon will not begin to crack (FIG. 27). Finally data set three is acquired after the dried sample is imbibed with a fluid. In this experiment brine was used to imbibe in a vacuum with minimal pressure (200 psi). The brine imbibition can take approximately two to three weeks while time and rate are monitored until rate flattens. (FIG. 27).

The SFC process (also referred to as a SFC workflow) was applied to the Sand Wash sample and the subsequent results for fluid types as well as total porosity can be observed in Table 1.

TABLE 1

| Porosity | NMR | GRI | Delta % |
|---|---|---|---|
| Total porosity | 17.1% | 6.32% | 170% |
| Movable bound porosity | 4.1% | Not resolved | |
| Capillary bound porosity | 3.5% | Not Resolved | |
| Clay bound porosity | 3.5% | Not Resolved | |
| Heavy hydrocarbon | 6.0% | Not Resolved | |
| Water saturation | 41% All bound | 60% | −31% |
| OOIP 100 ft thickness | 38.5 MMBO | 10MMBO | 285% |

Table 1 above are results using a SFC workflow (i.e., NMR data acquisition and NMR data processing) to determine fluid components of a reservoir of the Sand Wash sample, and as compared to results using the GRI methodology with the resultant delta (change).

The initial total porosity from the as received sample was 14% and after brine imbibition it rose to 17.1%. This was a substantial increase from the original GRI total porosity of 6.5%. Using the SFC, movable hydrocarbon was determined to be 4.1% rather than 1.5 to 2%. A comparison could not be made to GRI directly as GRI methodology does not separate movable hydrocarbons. In addition the SFC process determined a high amount of heavy hydrocarbons (6%), which is a likely contributor in the discrepancy in GRI total porosity to SFC total porosity. While the process does distinguish the fluid types and amounts there is still concern with an under prediction of porosity. It is likely that the movable hydrocarbon component is a minimum value due to the phenomena of lost light hydrocarbons after coring or during storage. For future endeavors it is recommended to take pressure cores to account for the lost hydrocarbon.

EXAMPLE II

Dry Gas Case Study

In order to confirm the versatility and applicability of the SFC methodology and high resolution NMR, an additional case study was undertaken in dry shale gas, as the previously mentioned Sand Wash example was in the black oil window. The reason for this undertaking is to observe if the high delta seen in the Sand Wash oil window would be repeatable in dry gas plays, which have significantly less heavy hydrocarbon due to high maturity. Fifteen samples were tested in the Marcellus and other plays in dry gas window using the same lab measurement parameters and SFC workflow that was used in the Sand-Wash case study. The SFC results were compared to GRI data as seen in Table 2 immediately below.

TABLE 2

Comparison of SFC Methodology and GRI Methodology for Fluid Components of the Marcellus Shale

| Porosity | SFC | GRI | Delta Change |
|---|---|---|---|
| Movable HC | 5.60% | 4.0% | 40% |
| Heavy Hydrocarbon | 3.00% | N/A | |
| Free Water | 0.00% | N/A | |
| Irreducible Water | 0.70% | N/A | |
| Clay Bound Water | 0.60% | N/A | |
| Water saturation | 18.8% | 31% | −40% |
| Total PHI | 9.9% | 5.8% | 70% |
| OGIP | 58.0 Bcf/Sec | 41 Bcf/Sec | 41% |

The results of the Marcellus study yielded an increase in movable porosity and consequently OGIP ("Original Gas In Place"). However as expected the results did not have as high of a delta as the samples in the oil window (Tables 1 & 2). While the delta was not as high as the Sand Wash example the delta in the OGIP was significant. When OGIP was calculate for other dry gas plays using the new porosity data from SFC the difference to GRI based OGIP is still quite large. All of these plays have had similar problems of matching porosity to production like the Sand Wash, and with the SFC based OGIP recovered results are more reasonable (Table 2).

Figure 28:
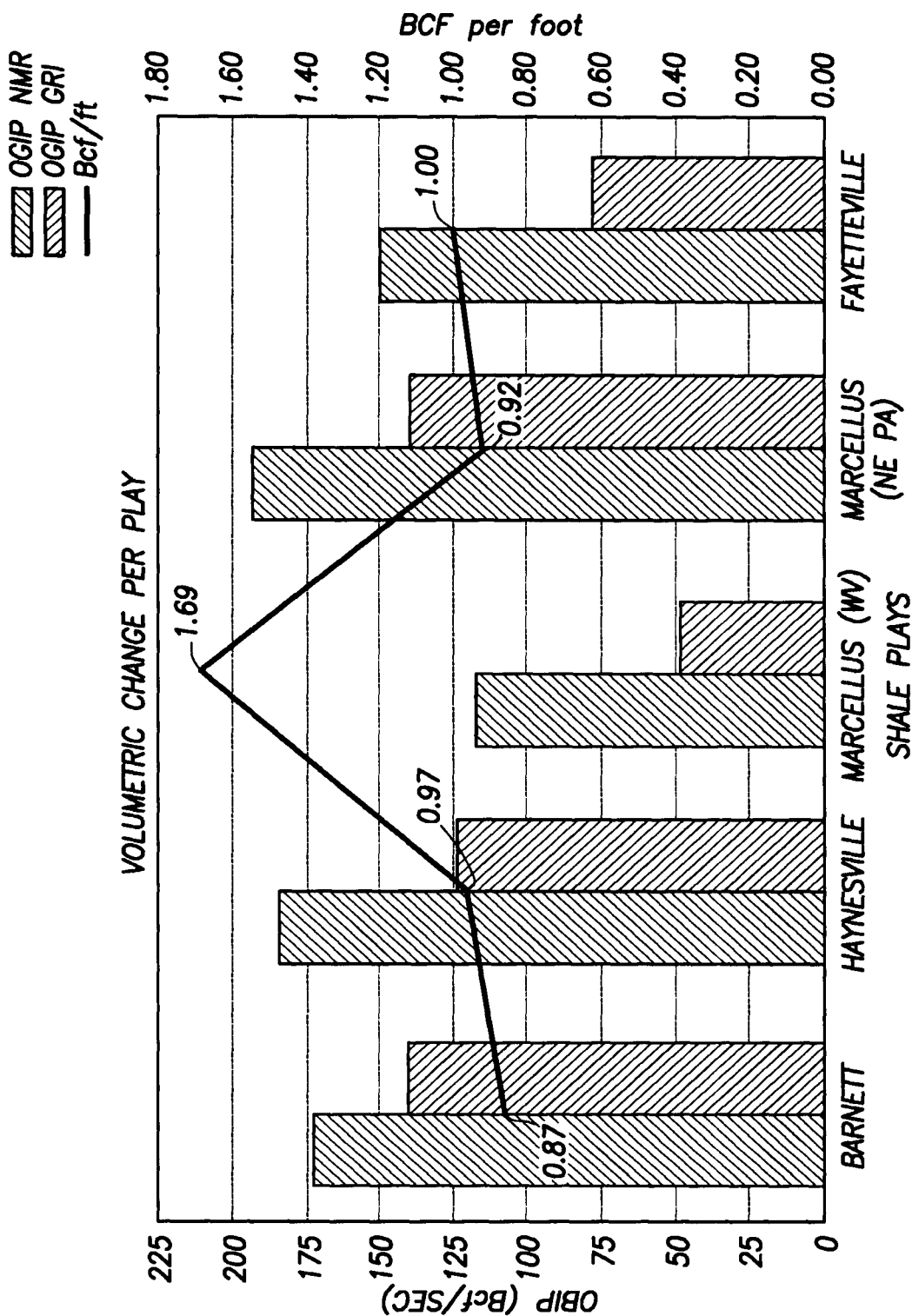
FIG. 28 is a graph illustrating the change in OGIP between plays using GRI and SFC methodologies. The line on the bar graph represents the Bcf/ft of each play, illustrating the relative richness per foot of hydrocarbon plays.

In addition to the change in OGIP the biggest delta would be the bcf/ft calculation on a play basis. With the new in place calculations a higher concentration of hydrocarbons on a per foot basis illustrates that plays with thinner units (less than 100 ft) can be viable if the bcf/ft is high enough. An example of this is illustrated in FIG. 28 with the high bcf/ft calculation of the Marcellus in West Virginia pan handle. The Marcellus in West Virginia pan handle reaches an approximate thickness of 70 ft, yet wells continually out produce in place estimates.

To upscale SFC porosity and characterize log porosity data so that the entire reservoir can be characterized and reserves more accurately identified, the equations provided immediately below can be utilized. The first equation gives us a grain density of rock which helps calculate porosity. Traditionally grain density is calculated from XRD (x-ray diffraction) or another lithology measurement. Our equation takes into account TOC and density of kerogen to account for total porosity including heavy hydrocarbon. Once the grain density is re-calculated it is put into the standard porosity (PHIT) equation.

$$GDEN_{NMR} = \frac{(GDEN_{XRD} - Ker\ Den * TOC_{WT})}{(1 - (TOC_{WT}))} \rightarrow PHIT = \frac{(GDEN_{NMR} - RHOB)}{(GDEN_{NMR} - RHOF)}$$

The above equations are useful for determining production efficiencies by quickly and accurately identifying sweet spots in produced wells.

As described above, methods and systems for determining location of hydrocarbon in unconventional plays are provided. The present methods comprise at least two steps of measuring formation samples using high resolution NMR, as received, as dried and/or as saturated, and subsequent processing the NMR data to determine one of several formation properties or components where the formation property or the component can be used to locate an oil or gas reservoir, complete a well, and/or increase production efficiency. The subject methods and systems presented herein further provide a series of ordered (sequential) combination of steps related to the financial evaluation of number of barrels of oil or cubic feet of gas that can be produced at a given location.

Table 3 below provides a breakdown of formation fluids measured by GRI sample methods and SFC described herein:

| Formation Fluid Type | GRI | NMR |
|---|---|---|
| Total formation water | ✓ Total water saturation | ✓ |
| Free (movable) water | X Unable to breakdown water into moveable & bound fractions | ✓Due to unique response of each fluid to NMR, can separate water fraction into movable bound |
| Capillary bound water | X Unable to breakdown water into moveable & bound fractions | ✓Due to unique response of each fluid to NMR, can separate water fraction into movable bound |
| Clay bound water | X Unable to breakdown water into moveable & bound fractions | ✓Due to unique response of each fluid to NMR, can separate water fraction into movable bound |
| Hydrocarbon | ? Dependent on cleaning | ✓Cleaning not an issue |
| Gas | ? | ✓NMR can differentiate hydrocarbon bearing fluids based on its viscosity and molecular structure & helps distinguish between fluids |

-continued

| Formation Fluid Type | GRI | NMR |
|---|---|---|
| Oil | ? | ✓NMR can differentiate hydrocarbon bearing fluids based on its viscosity and molecular structure & helps distinguish between fluids |
| Heavy hydrocarbon fractions | X Dependent on cleaning | ✓NMR can differentiate hydrocarbon bearing fluids based on its viscosity and molecular structure & helps distinguish between fluids |
| TOC | X No measurement | ✓NMR can differentiate hydrocarbon bearing fluids based on its viscosity and molecular structure & helps distinguish between fluids |

We claim:

1. A method for determining location of hydrocarbon in unconventional plays:
comprising the steps of:
   (a) receiving a sample from a reservoir;
   (b) performing an NMR measurement on the formation sample to acquire a first NMR data set;
   (c) drying the sample to form a dried sample;
   (d) performing an NMR measurement on the dried sample to acquire a second NMR data set:
   (e) saturating the dried sample with a fluid to form a saturated sample;
   (f) performing an NMR measurement on the saturated sample to acquire a third NMR data set; and
   (g) analyzing the first NMR data set, the second NMR data set and the third NMR data set to obtain at least one formation property or one component, wherein the formation property or the component is used to locate an oil or gas reservoir or well, and/or complete the well.

2. The method of claim 1, wherein the formation property or component is selected from the group consisting of total porosity, moveable fluid porosity, capillary bound fluid porosity, clay bound fluid porosity, residual hydrocarbon, and heavy hydrocarbon.

3. The method of claim 1, wherein the fluid is brine.

4. The method of claim 1, wherein the sample is dried for at least a day.

5. The method of claim 1, wherein the first NMR data set is an as received sample matrix, the second NMR data set is a dry sample matrix, and the "as received" sample matrix minus the "dry" sample matrix represents one or more of the following: capillary bound fluid, clay bound water, residual hydrocarbon and/or capillary bound porosity.

6. The method of claim 5, wherein the third NMR data set is a saturation sample matrix and the saturation sample matrix minus the dry sample matrix quantifies mobile hydrocarbon.

7. A method of sequential fluid characterization comprising the steps of:
   obtaining a sample from a reservoir;
   acquiring a first set of high resolution NMR data on the sample;
   drying the sample to produce dried sample;
   acquiring a second set of high resolution NMR data on the dried sample;
   determining residual hydrocarbon, heavy hydrocarbon and capillary bound porosity based on the first and the second sets of NMR data; and
   commencing oil and/or gas production based on the determination of the heavy hydrocarbon and/or the residual hydrocarbon.

8. A method of sequential fluid characterization comprising the steps of:
   obtaining a sample from a reservoir;
   drying the sample to produce dried sample;
   acquiring a first set of high resolution NMR data on the dried sample;
   saturating the sample with a fluid;
   acquiring a second set of high resolution NMR data on the saturated sample; and
   determining movable porosity based on the first and the second sets of NMR data; and
   commencing oil or gas production based on the determination of a heavy hydrocarbon and/or a residual hydrocarbon.

9. A method of sequential fluid characterization comprising the steps of:
   obtaining a sample from a reservoir;
   acquiring a first set of high resolution NMR data on the sample;
   drying the sample to produce dried sample;
   acquiring a second set of high resolution NMR data on the dried sample;
   determining movable porosity based on the first and the second sets of NMR data; and
   commencing oil or gas production based on the determination of a heavy hydrocarbon and/or a residual hydrocarbon.

* * * * *